US006546628B2

(12) United States Patent
Silverbrook

(10) Patent No.: US 6,546,628 B2
(45) Date of Patent: Apr. 15, 2003

(54) PRINTHEAD CHIP

(75) Inventor: Kia Silverbrook, Balmain (AU)

(73) Assignee: Silverbrook Research Pty Ltd, Balmain (AU)

( * ) Notice: Subject to any disclaimer, the term of this patent is extended or adjusted under 35 U.S.C. 154(b) by 0 days.

(21) Appl. No.: 10/171,653

(22) Filed: Jun. 17, 2002

(65) Prior Publication Data

US 2002/0189098 A1 Dec. 19, 2002

Related U.S. Application Data

(63) Continuation of application No. 09/575,125, filed on May 23, 2000.

(51) Int. Cl.[7] ............................................ H01L 21/00
(52) U.S. Cl. .......................... 29/890.1; 216/27; 438/21; 347/20; 347/47; 347/56
(58) Field of Search ............................ 29/25.01, 890.1; 216/2, 27; 438/21; 347/20, 26, 27, 44, 47, 54, 56, 57, 58, 59

(56) References Cited

U.S. PATENT DOCUMENTS 5,922,218 A * 7/1999 Miyata et al. ................ 216/27
6,180,427 B1 * 1/2001 Silverbrook ................. 438/21
6,254,793 B1 * 7/2001 Silverbrook ................. 216/27

* cited by examiner

*Primary Examiner*—David J. Walczak
*Assistant Examiner*—Peter deVore

(57) ABSTRACT

A method of fabricating a printhead chip for an ink jet printhead includes forming a drive circuitry layer on a wafer substrate. A first sacrificial layer is deposited on the drive circuitry layer. The first sacrificial layer is etched to form a deposit area for an actuator layer. Actuator material is deposited on the first sacrificial layer to form the actuator layer. The actuator layer is etched to define an actuator and a first part of nozzle chamber walls of each of a plurality of nozzle assemblies. The first sacrificial layer is etched to release each actuator and each first part of the nozzle chamber walls. At least one of the wafer substrate and the first sacrificial layer is etched to define a plurality of ink inlets, so that each ink inlet is in fluid communication with a respective nozzle chamber.

8 Claims, 27 Drawing Sheets

PRINTHEAD CHIP

This is a continuation application of U.S. application Ser. No: 09/575,125 Filed on May 23, 2000.

REFERENCES TO RELATED APPLICATIONS

This application is a continuation application of U.S. application Ser. No. 09/575,125, filed May. 23, 2000. Various methods, systems and apparatus relating to the present invention are disclosed in the following co-pending applications filed by the applicant or assignee of the present invention simultaneously with the present application:

| | | | | |
|---|---|---|---|---|
| 09/575,197 | 091575,195 | 09/575,159 | 09/575,132 | 09/575,123 |
| 09/575,148 | 09/575,130 | 09/575,165 | 09/575,153 | 09/575,118 |
| 09/575,131 | 09/575,116 | 09/575,144 | 09/575,139 | 09/575,186 |
| 09/575,185 | 09/575,191 | 09/575,145 | 09/575,192 | 09/575,181 |
| 09/575,193 | 9/575,156 | 09/575,183 | 09/575,160 | 09/575,150 |
| 09/575,169 | 09/575,184 | 09/575,128 | 09/575,180 | 09/575,149 |
| 09/575,179 | 09/575,133 | 09/575,143 | 09/575,187 | 09/575,155 |
| 09/575,196 | 09/575,198 | 09/575,178 | 09/575,164 | 09/575,146 |
| 09/575,174 | 09/575,163 | 09/575,168 | 09/575,154 | 09/575,129 |
| 09/575,124 | 09/575,188 | 09/575,189 | 09/575,162 | 09/575,172 |
| 09/575,170 | 09/575,171 | 09/575,161 | 09/575,141 | 09/575,125 |
| 09/575,142 | 09/575,140 | 09/575,190 | 09/575,138 | 09/575,126 |
| 09/575,127 | 09/575,158 | 09/575,117 | 09/575,147 | 09/575,152 |
| 09/575,176 | 09/575,151 | 09/575,177 | 09/575,175 | 09/575,115 |
| 09/575,114 | 09/575,113 | 09/575,112 | 09/575,111 | 09/575,108 |
| 09/575,109 | 09/575,182 | 09/575,173 | 09/575,194 | 09/575,136 |
| 09/575,119 | 09/575,135 | 09/575,157 | 09/575,166 | 09/575,134 |
| 09/575,121 | 09/575,137 | 09/575,167 | 09/575,120 | 09/575,122 |

These applications are incorporated by reference.

FIELD OF THE INVENTION

This invention relates to an ink jet printhead chip. More particularly, the invention relates to an ink jet printhead chip and a method of manufacturing an inkjet printhead chip.

BACKGROUND TO THE INVENTION

As set out in the material incorporated by reference, the Applicant has developed ink jet printheads that can span a print medium and incorporate up to 84 000 nozzle assemblies.

These printheads include a number of printhead chips. One of these is the subject of this invention. The printhead chips include micro-electromechanical components that physically act on ink to eject ink from the printhead chips.

The printhead chips are manufactured using integrated circuit fabrication techniques. Those skilled in the art know that such techniques involve deposition and etching processes. The processes are carried out until the desired integrated circuit is formed.

The micro-electromechanical components are by definition microscopic. It follows that integrated circuit fabrication techniques are particularly suited to the manufacture of such components. In particular, the techniques involve the use of sacrificial layers. The sacrificial layers support active layers. The active layers are shaped into components. The sacrificial layers are etched away to free the components.

Cost is a major factor in approving the manufacture of such devices. Cost is primarily dependent on the number of steps required to fabricate the device. Fabrication of mask sets is a one-off task. However, an extra step in an industrial process will have to be repeated many thousands of times. It follows that it is important for a fabrication process to incorporate as few steps as possible.

Applicant has conceived this invention to achieve such a process. In particular, the Applicant has devised a printhead chip that requires a reduced number of fabrication steps.

SUMMARY OF THE INVENTION

According to a first aspect of the invention, there is provided a method of fabricating a printhead chip for an ink jet printhead the printhead chip including a plurality of nozzle assemblies positioned on a wafer substrate that incorporates a drive circuitry layer, each nozzle assembly having nozzle chamber walls and a roof that define a nozzle chamber and an ink ejection port and an actuator, connected to the drive circuitry layer, that is operatively positioned with respect to the nozzle chamber to act on ink within the nozzle chamber to eject the ink from the nozzle chamber, the method comprising the steps of:

- depositing a first sacrificial layer on the wafer substrate;
- etching the first sacrificial layer to form a deposit area for an actuator layer;
- depositing actuator material on the first sacrificial layer to form the actuator layer;
- etching the actuator layer to define the actuator and a first part of the nozzle chamber walls of each nozzle assembly;
- etching the first sacrificial layer to release each actuator and each first part of the nozzle chamber walls; and
- etching at least one of the wafer substrate and the first sacrificial layer to define a plurality of ink inlets, so that each ink inlet is in fluid communication with a respective nozzle chamber.

The method may include the steps of:

- depositing a second layer of sacrificial material on the actuator layer;
- etching the second layer of sacrificial material to form a deposit area for a structural layer;
- depositing structural material on the second layer of sacrificial material to form the structural layer; and
- etching the structural layer to form a second part of the nozzle chamber walls of each nozzle assembly, the steps of depositing the first and second layers of sacrificial material, the actuator material and the structural material and etching the sacrificial material, the actuator material and the structural material being carried out so that the first and second parts of the nozzle chamber walls define a fluidic seal between the first and second parts when the nozzle chamber is filled with ink.

The steps of depositing the first and second layers of sacrificial material, the actuator material and the structural material and etching the sacrificial material, the actuator material and the structural material may be carried out so that the structural material defines the roof wall in addition to said second part of the nozzle chamber walls and the ink ejection port defined in the roof wall.

The steps of depositing the first and second layers of sacrificial material, the actuator material and the structural material and etching the sacrificial material, the actuator material and the structural material may be carried out so that the first part of the nozzle chamber walls is fast with the substrate, while the second part is connected to the actuator to be displaceable towards the first part to reduce a volume of the nozzle chamber to eject ink from the ink ejection port and away from the first part to refill the nozzle chamber.

According to a second aspect of the invention, there is provided a printhead chip for an inkjet printhead, the printhead chip comprising

- a wafer substrate;
- a drive circuitry layer positioned in the wafer substrate;
- a plurality of nozzle assemblies positioned on the wafer substrate, each nozzle assembly comprising
  - nozzle chamber walls and roof walls that define a plurality of nozzle chambers and ink ejection ports, each ink ejection port being in fluid communication with a respective nozzle chamber; and
  - a plurality of actuators connected to the drive circuitry layer, each actuator being operatively positioned with respect to a corresponding nozzle chamber so that each actuator can act on ink within a respective nozzle chamber to eject the ink from that nozzle chamber, the actuator and a first part of the nozzle chamber walls both constituting actuator material; and
- one of the wafer and nozzle chamber walls defining an ink inlet in fluid communication with the nozzle chamber.

The first part of the nozzle chamber walls may be fast with the substrate. A second part of the nozzle chamber walls and the roof walls may each connected to respective actuators to be displaceable towards the substrate to reduce a volume in each nozzle chamber to eject ink from the ink ejection port and away from the substrate to refill the nozzle chamber.

The first and second parts of the nozzle chamber walls may be shaped to define a fluidic seal to inhibit the egress of ink from the nozzle chambers when the first and second parts of the nozzle chamber walls are displaced with respect to each other.

Each actuator may be elongate with one end anchored to the substrate in electrical connection with the drive circuitry layer and an opposed end connected to the second part of the nozzle chamber walls and roof wall. The actuator may be of a material and may be configured so that the actuator is displaced towards the substrate when heated and away from the substrate when cooled, to displace the actuator and thus the nozzle chamber walls and roof wall towards and away from the substrate.

Two beams may constitute the thermal bend actuator, one being an active beam and the other being a passive beam. By "active beam" is meant that a current is caused to flow through the active beam upon activation of the actuator whereas there is no current flow through the passive beam. It will be appreciated that, due to the construction of the actuator, when a current flows through the active beam it is caused to expand due to resistive heating. Due to the fact that the passive beam is constrained, a bending motion is imparted to the connecting member for effecting displacement of the nozzle.

The beams may be anchored at one end to an anchor mounted on, and extending upwardly from, the substrate and connected at their opposed ends to a connecting member. The connecting member may comprise an arm having a first end connected to the actuator with the second part of the nozzle chamber walls and the roof wall connected to an opposed end of the arm in a cantilevered manner. Thus, a bending moment at said first end of the arm is exaggerated at said opposed end to effect the required displacement of the second part of the nozzle chamber walls and roof wall.

BRIEF DESCRIPTION OF THE DRAWINGS

The invention is now described, by way of example, with reference to the accompanying diagrammatic drawings in which.

DETAILED DESCRIPTION OF THE DRAWINGS

Figure 1:
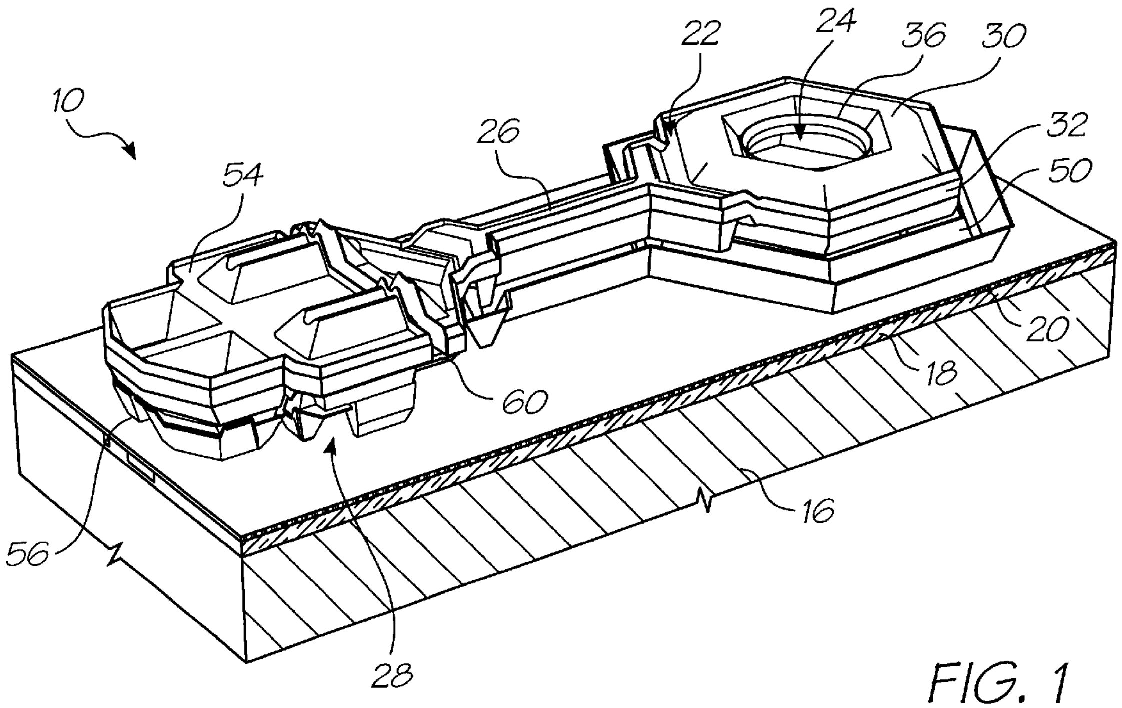
FIG. 1 shows a three dimensional, schematic view of a nozzle assembly of a printhead chip of the invention.

In FIG. 1 of the drawings, a nozzle assembly of a printhead chip 14 (FIGS. 5 and 6) of the invention is designated generally by reference 10. The printhead chip 14 has a plurality of nozzle assemblies 10 arranged in an array on a wafer substrate in the form of a silicon substrate 16. The substrate 16 incorporates a drive circuitry layer in the form of a CMOS layer.

A dielectric layer 18 is deposited on the substrate 16. A CMOS passivation layer 20 is deposited on the dielectric layer 18 to protect the drive circuitry layer.

Each nozzle assembly 10 includes nozzle chamber walls 22 defining an ink ejection port 24 in a roof wall 30 and a nozzle chamber 34. The ink ejection port 24 is in fluid communication with the nozzle chamber 34. A lever arm 26 extends from the roof wall 30. An actuator 28 is anchored to the substrate 16 at one end and is connected to the lever arm 26 at an opposite end.

The roof wall is in the form of a crown portion 30. A skirt portion 32 depends from the crown portion 30. The skirt portion 32 forms a first part of a peripheral wall of the nozzle chamber 34.

Figure 2:
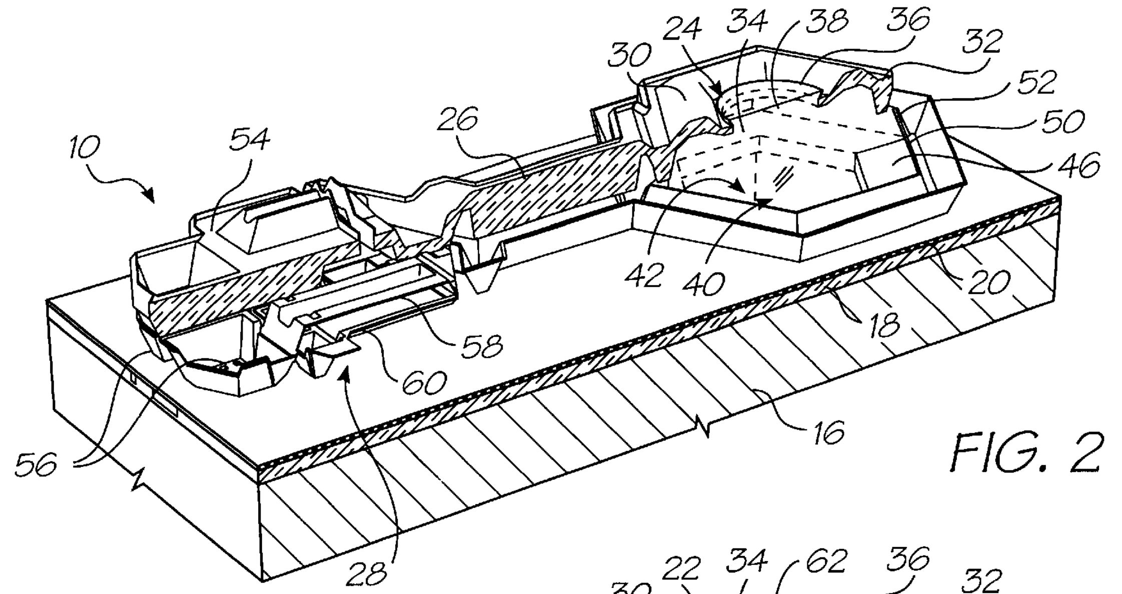
FIGS. 2 to 4 show a three dimensional, schematic illustration of an operation of the nozzle assembly of FIG. 1.

The crown portion 30 defines a raised rim 36, which "pins" a meniscus 38 (FIG. 2) of a body of ink 40 in the nozzle chamber 34.

An ink inlet in the form of an aperture 42 (shown most clearly in FIG. 6 of the drawings) is defined in a floor 46 of the nozzle chamber 34. The aperture 42 is in fluid communication with an ink inlet channel 48 defined through the substrate 16.

A second part of the peripheral wall in the form of a wall portion 50 bounds the aperture 42 and extends upwardly from the floor 46.

The wall portion 50 has an inwardly directed lip 52 at its free end, which serves as a fluidic seal. The fluidic seal inhibits the escape of ink when the crown and skirt portions 30, 32 are displaced, as described in greater detail below.

It will be appreciated that, due to the viscosity of the ink 40 and the small dimensions of the spacing between the lip 52 and the skirt portion 32, the inwardly directed lip 52 and surface tension function as a seal for inhibiting the escape of ink from the nozzle chamber 34.

The actuator 28 is a thermal bend actuator and is connected to an anchor 54 extending upwardly from the substrate 16 or, more particularly, from the CMOS passivation layer 20. The anchor 54 is mounted on conductive pads 56 which form an electrical connection with the actuator 28.

The actuator 28 comprises a first, active beam 58 arranged above a second, passive beam 60. In a preferred embodiment, both beams 58 and 60 are of, or include, a conductive ceramic material such as titanium nitride (TiN).

Figure 3:
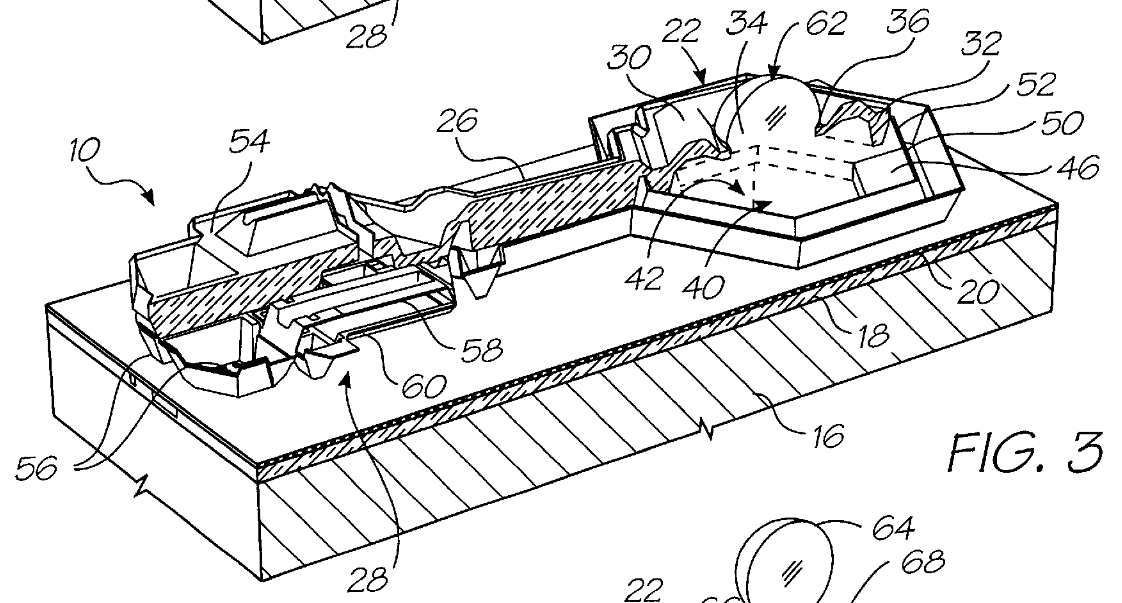
Figure 4:
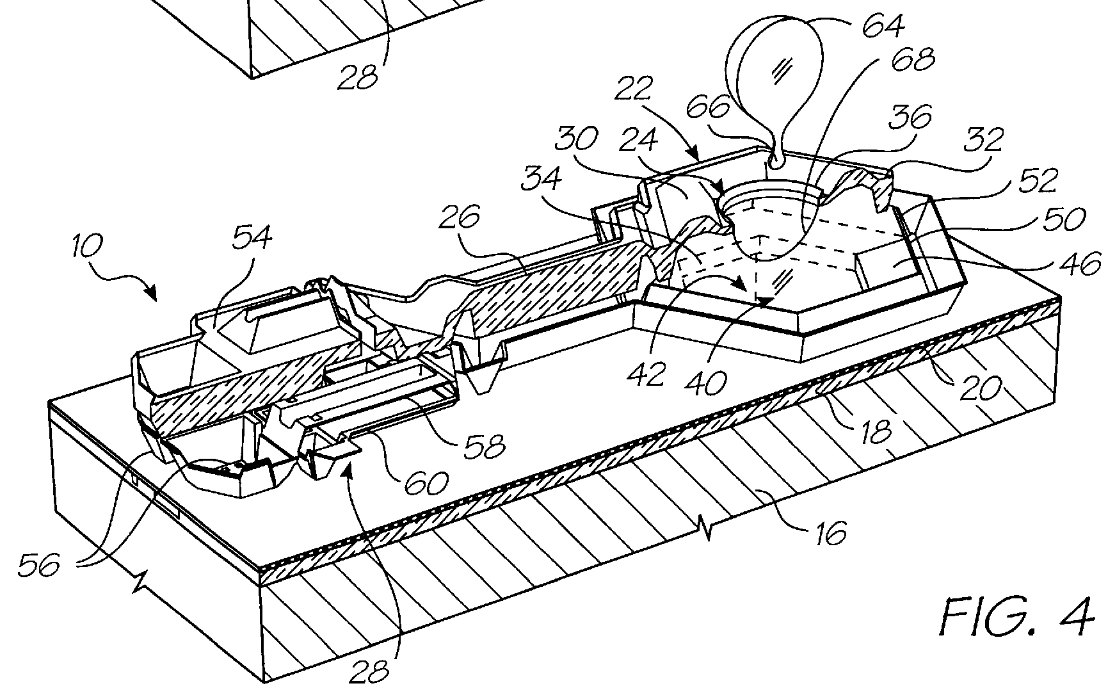

Both beams 58 and 60 have their first ends anchored to the anchor 54 and their opposed ends connected to the arm 26. When a current is caused to flow through the active beam 58 thermal expansion of the beam 58 results. As the passive beam 60, through which there is no current flow, does not expand at the same rate, a bending moment is created causing the arm 26 and thus the crown and skirt portions 30, 32 to be displaced downwardly towards the substrate 16 as shown in FIG. 3 of the drawings. This causes an ejection of ink through the ink ejection port 24 as shown at 62 in FIG. 3 of the drawings. When the source of heat is removed from the active beam 58, i.e. by stopping current flow, the portions 30, 32 return to a quiescent position as shown in FIG. 4 of the drawings. The return movement causes an ink droplet 64 to form as a result of the breaking of an ink droplet neck as illustrated at 66 in FIG. 4 of the drawings. The ink droplet 64 then travels on to the print media such as a sheet of paper. As a result of the formation of the ink droplet 64, a "negative" meniscus is formed as shown at 68 in FIG. 4 of the drawings. This "negative" meniscus 68 results in an inflow of ink 40 into the nozzle chamber 34 such that a new meniscus 38 (FIG. 2) is formed in readiness for the next ink drop ejection from the nozzle assembly 10.

Figure 5:
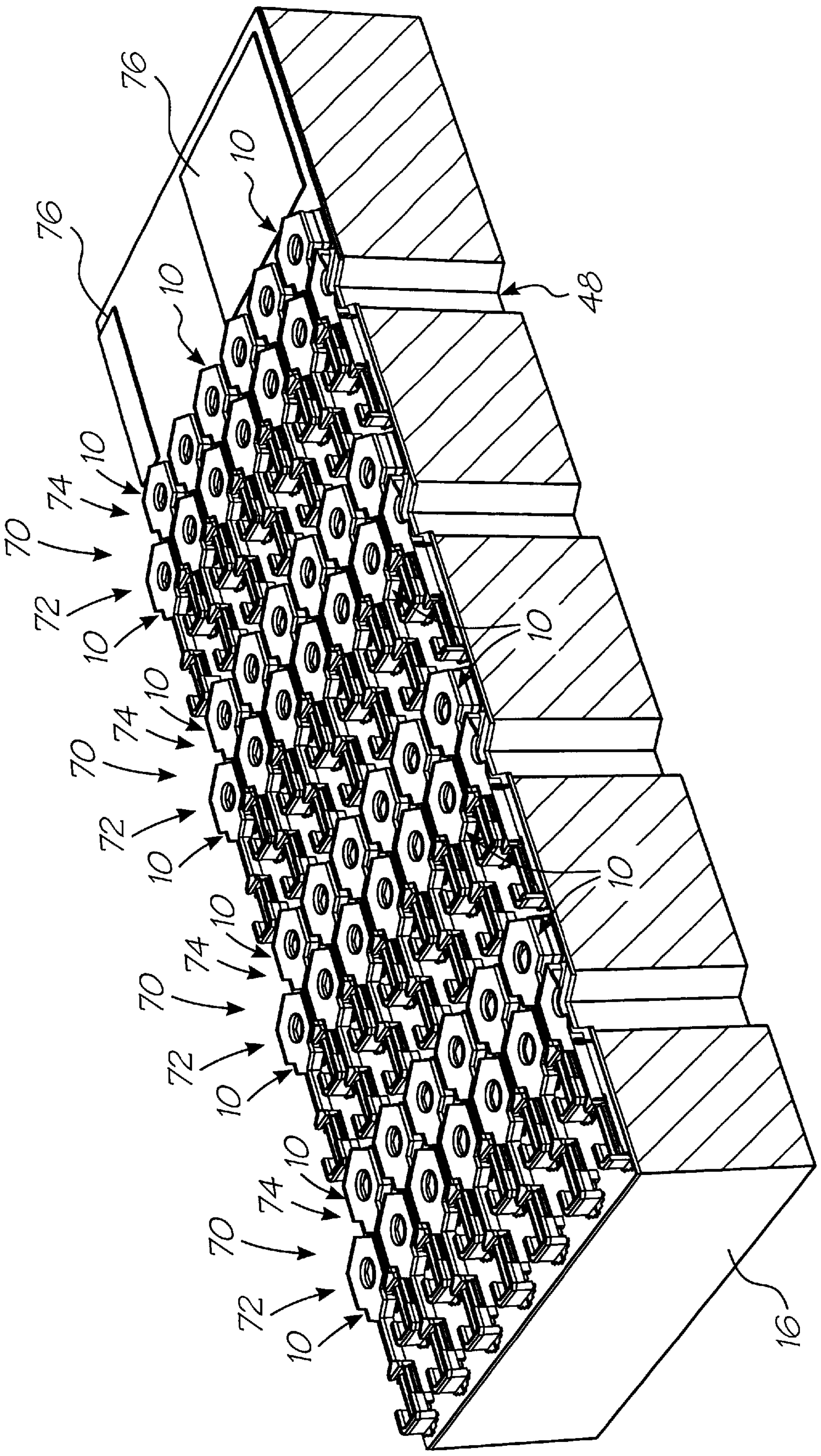
FIG. 5 shows a three-dimensional view of an array of the nozzle assemblies of FIGS. 1 to 4 constituting the printhead chip of the invention.
Figure 6:
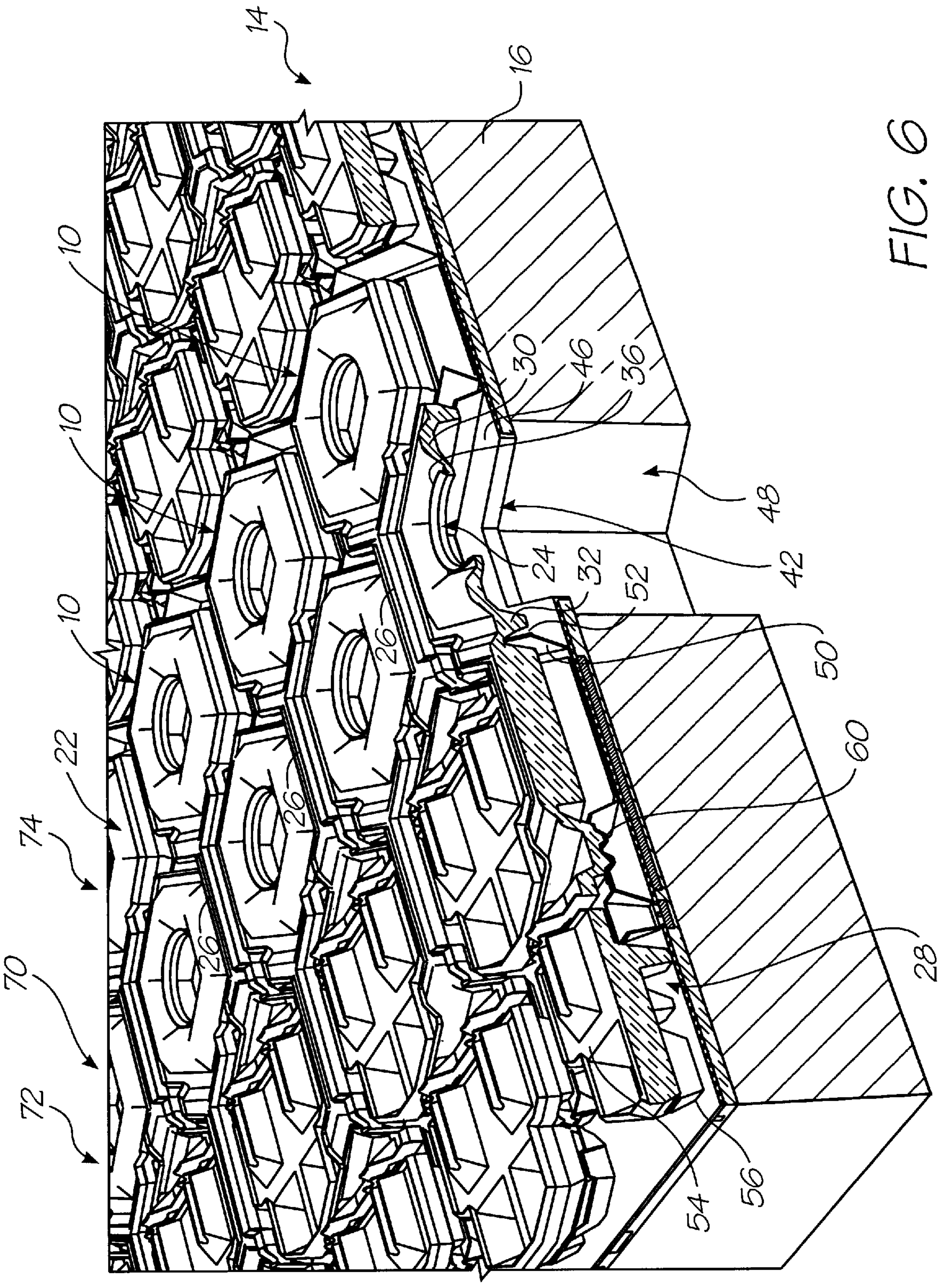
FIG. 6 shows, on an enlarged scale, part of the array of FIG. 5.

The nozzle array 14 is described in greater detail in FIGS. 5 and 6. The array 14 is for a four-color printhead. Accordingly, the array 14 includes four groups 70 of nozzle assemblies, one for each color. Each group 70 has its nozzle assemblies 10 arranged in two rows 72 and 74. One of the groups 70 is shown in greater detail in FIG. 6 of the drawings.

To facilitate close packing of the nozzle assemblies 10 in the rows 72 and 74, the nozzle assemblies 10 in the row 74 are offset or staggered with respect to the nozzle assemblies 10 in the row 72. Also, the nozzle assemblies 10 in the row 72 are spaced apart sufficiently far from each other to enable the lever arms 26 of the nozzle assemblies 10 in the row 74 to pass between adjacent nozzle chamber walls 22 of the assemblies 10 in the row 72. It is to be noted that each nozzle assembly 10 is substantially dumbbell shaped so that the nozzle chamber walls 22 in the row 72 nest between the nozzle chamber walls 22 and the actuators 28 of adjacent nozzle assemblies 10 in the row 74.

Further, to facilitate close packing of the nozzle chamber walls 22 in the rows 72 and 74, the nozzle chamber walls 22 are substantially hexagonally shaped.

It will be appreciated by those skilled in the art that, when the crown and skirt portions 30, 32 are displaced towards the substrate 16, in use, due to the ink ejection port 24 being at a slight angle with respect to the nozzle chamber 34, ink is ejected slightly off the perpendicular. It is an advantage of the arrangement shown in FIGS. 5 and 6 of the drawings that the actuators 28 of the nozzle assemblies 10 in the rows 72 and 74 extend in the same direction to one side of the rows 72 and 74. Hence, the ink droplets ejected from the ink ejection ports 24 in the row 72 and the ink droplets ejected from the ink ejection ports 24 in the row 74 are parallel to one another resulting in an improved print quality.

Also, as shown in FIG. 5 of the drawings, the substrate 16 has bond pads 76 arranged thereon which provide the electrical connections, via the pads 56, to the actuators 28 of the nozzle assemblies 10. These electrical connections are formed via the CMOS layer (not shown).

Figure 7:
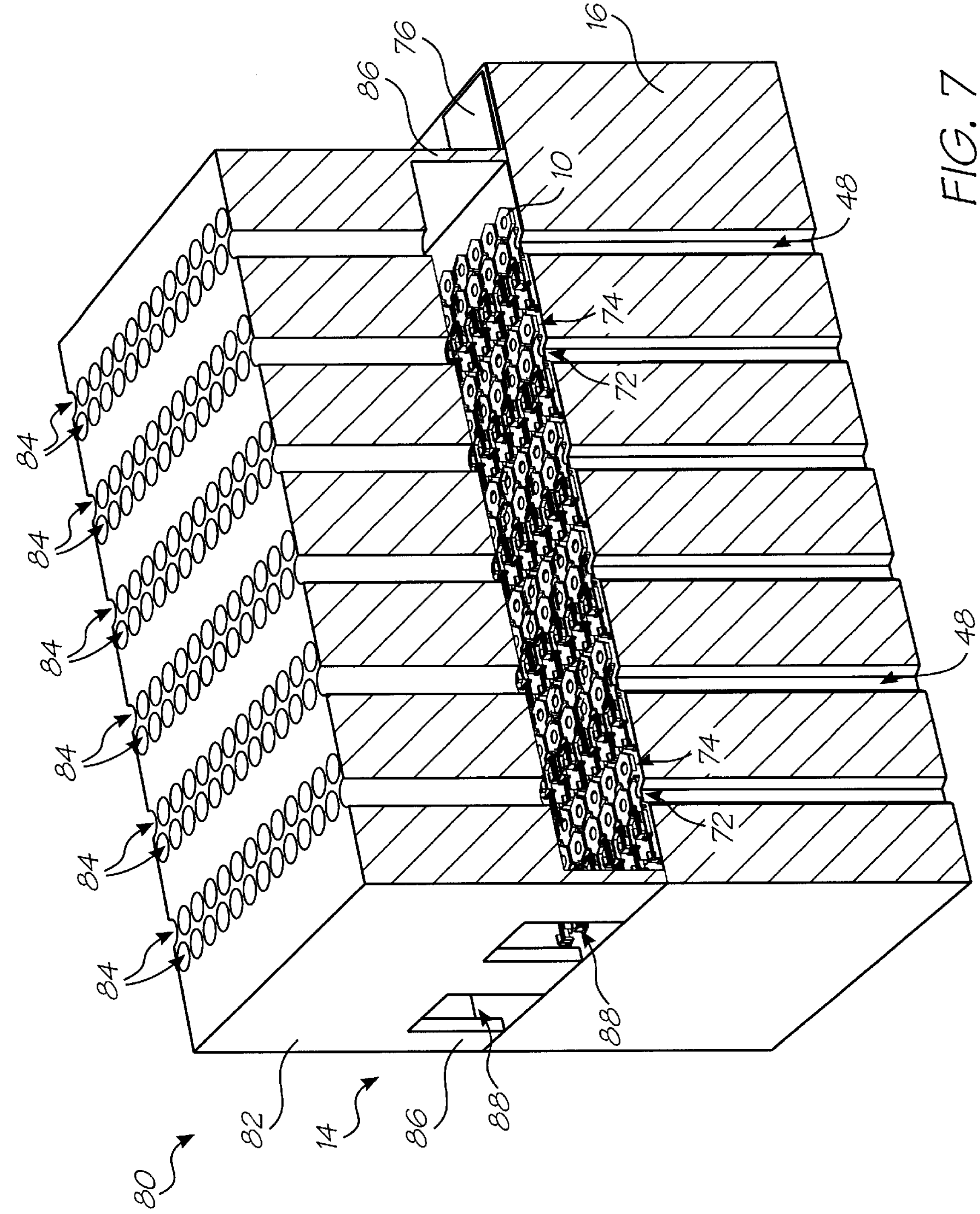
FIG. 7 shows a three dimensional view of the ink jet printhead chip with a nozzle guard positioned over the printhead chip.
Figure 9A:
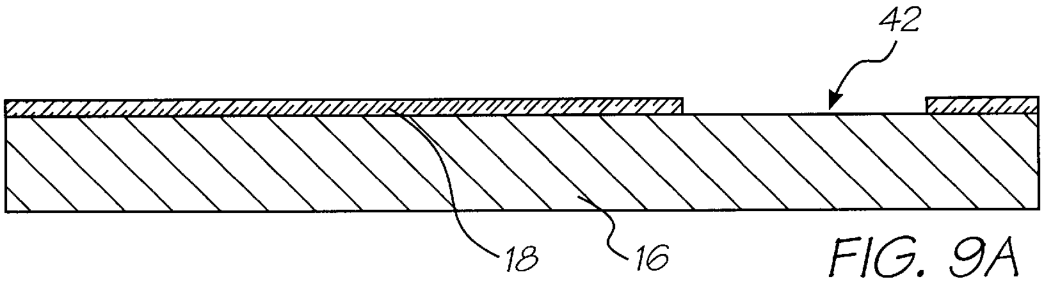
FIGS. 9*a* to 9*r* show sectional side views of the steps of FIGS. 8*a* to 8*r*.
Figure 10A:
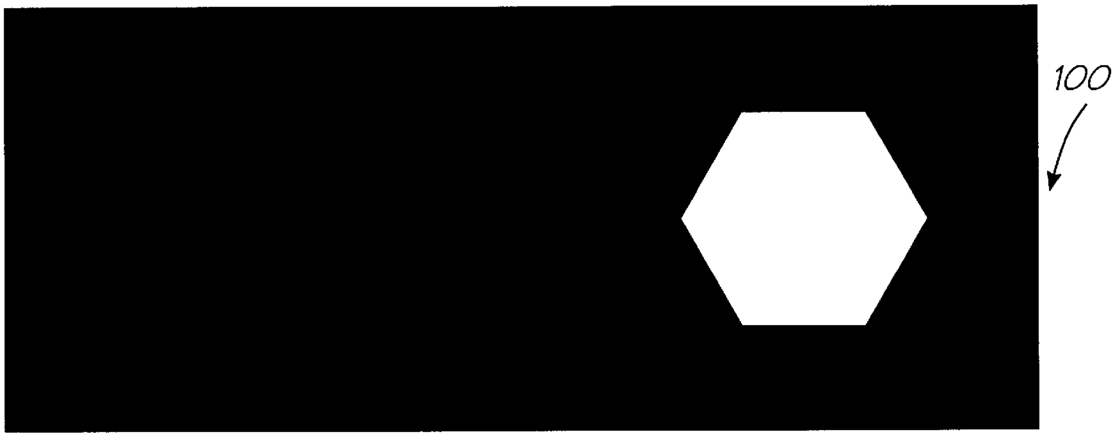
FIGS. 10*a* to 10*k* show masks used in the steps of FIGS. 8*a* to 8*r*.

Referring to FIG. 7 of the drawings, a development of the invention is shown. With reference to the previous drawings, like reference numerals refer to like parts, unless otherwise specified.

A nozzle guard 80 is mounted on the substrate 16 of the array 14. The nozzle guard 80 includes a planar cover member 82 that defines a plurality of passages 84. The passages 84 are in register with the nozzle openings 24 of the nozzle assemblies 10 of the array 14 such that, when ink is ejected from any one of the nozzle openings 24, the ink passes through the associated passage 84 before striking the print media.

The cover member 82 is mounted in spaced relationship relative to the nozzle assemblies 10 by a support structure in the form of limbs or struts 86. One of the struts 86 has air inlet openings 88 defined therein.

The cover member 82 and the struts 86 are of a wafer substrate. Thus, the passages 84 are formed with a suitable etching process carried out on the cover member 82. The cover member 82 has a thickness of not more than approximately 300 microns. This speeds the etching process. Thus, the manufacturing cost is minimized by reducing etch time.

In use, when the printhead chip 14 is in operation, air is charged through the inlet openings 88 to be forced through the passages 84 together with ink travelling through the passages 84.

The ink is not entrained in the air since the air is charged through the passages 84 at a different velocity from that of the ink droplets 64. For example, the ink droplets 64 are ejected from the ink ejection ports 24 at a velocity of approximately 3 m/s. The air is charged through the passages 84 at a velocity of approximately 1 m/s.

The purpose of the air is to maintain the passages 84 clear of foreign particles. A danger exists that these foreign particles, such as dust particles, could fall onto the nozzle assemblies 10 adversely affecting their operation. With the provision of the air inlet openings 88 in the nozzle guard 80 this problem is, to a large extent, obviated.

Referring now to FIGS. 8 to 10 of the drawings, a process for manufacturing the printhead chip 14 is described with reference to one of the nozzle assemblies 10.

Starting with the silicon substrate or wafer 16, the dielectric layer 18 is deposited on a surface of the wafer 16. The dielectric layer 18 is in the form of approximately 1.5 microns of CVD oxide. Resist is spun on to the layer 18 and the layer 18 is exposed to mask 100 and is subsequently developed.

After being developed, the layer 18 is plasma etched down to the silicon layer 16. The resist is then stripped and the layer 18 is cleaned. This step defines the ink inlet aperture 42.

Figure 8A:
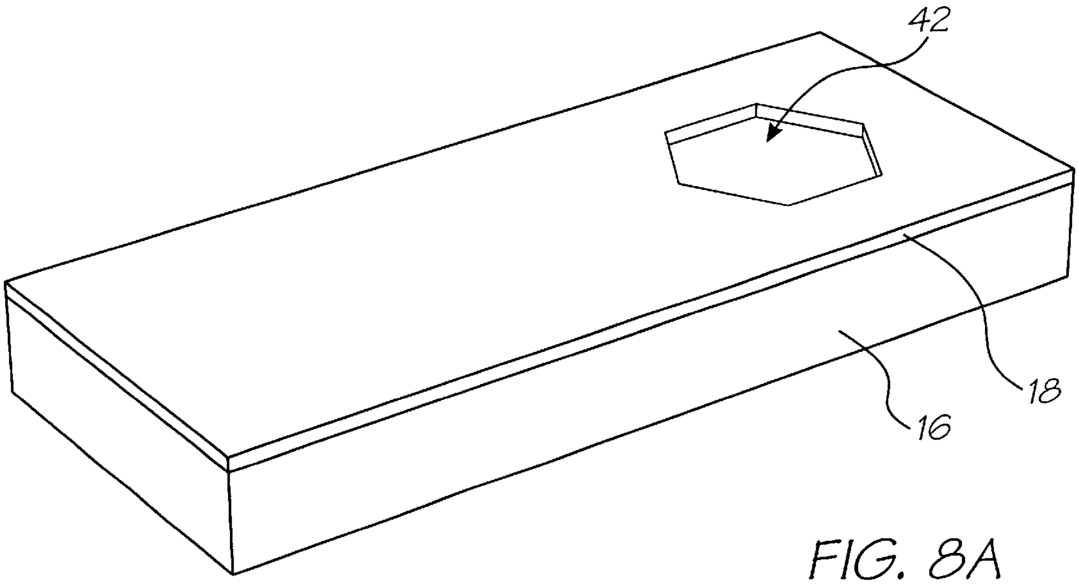
FIGS. 8*a* to 8*r* show three-dimensional views of steps in a method, of the invention, of fabricating a printhead chip, with reference to the nozzle assembly of FIG. 1.
Figure 8B:
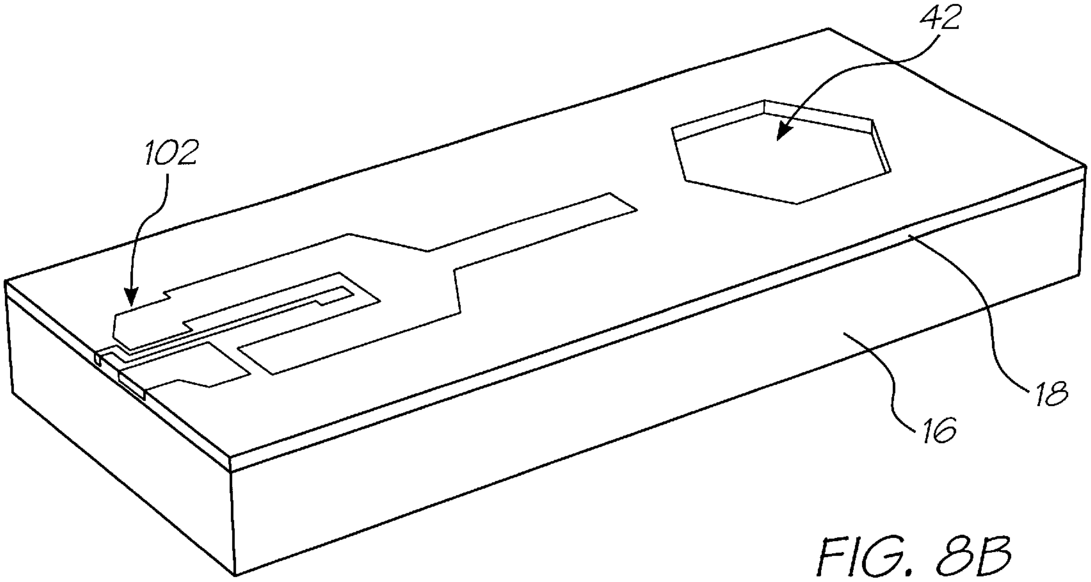
Figure 9B:
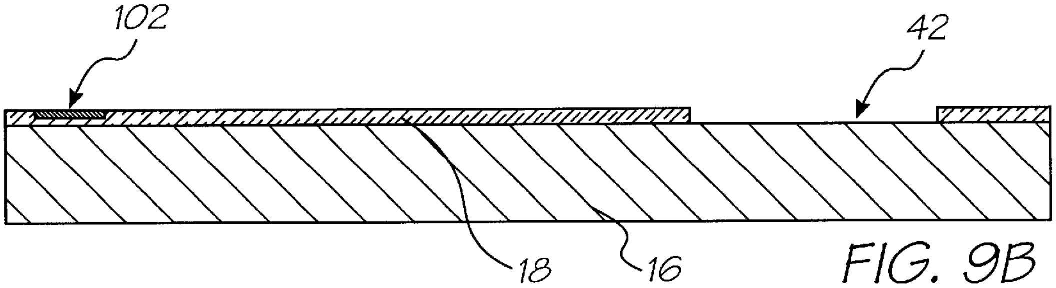
Figure 10B:
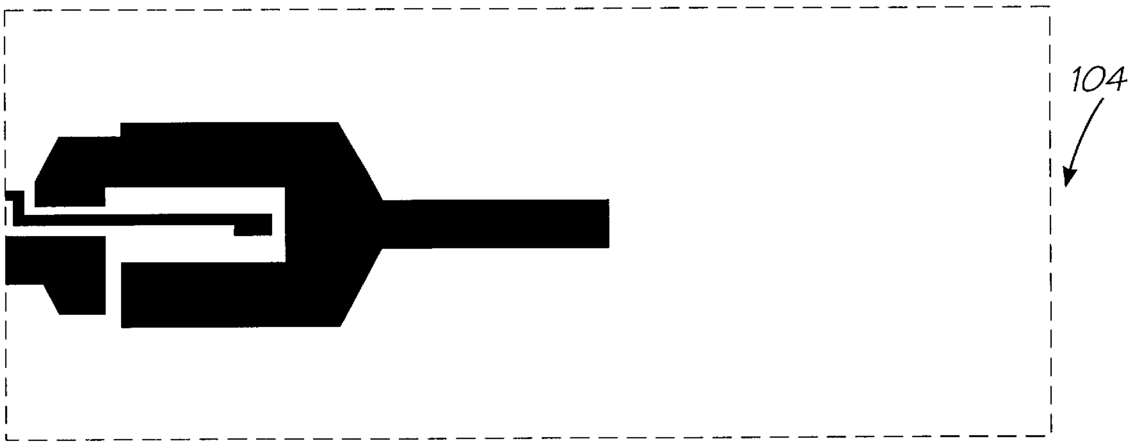
Figure 8C:
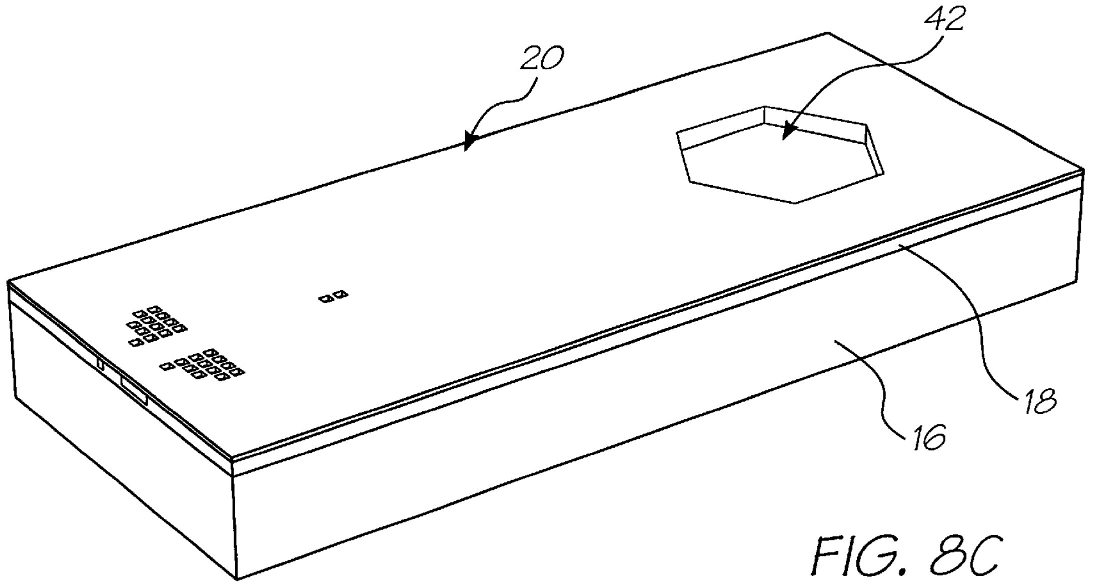
Figure 9C:
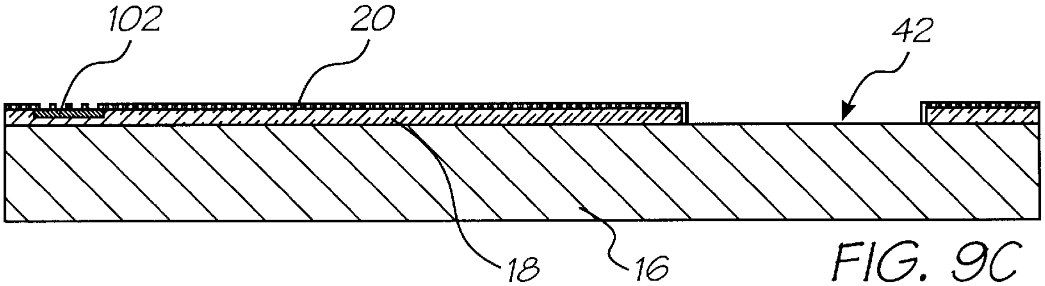
Figure 10C:
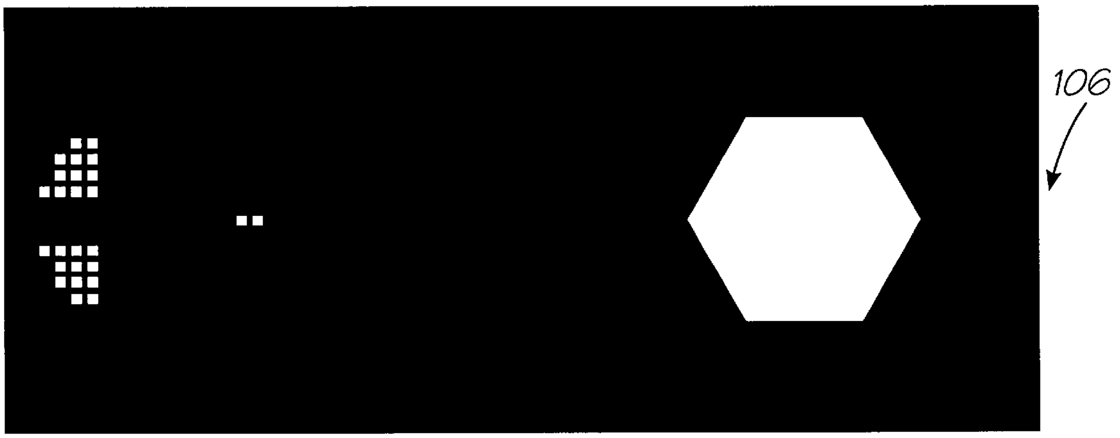
Figure 8D:
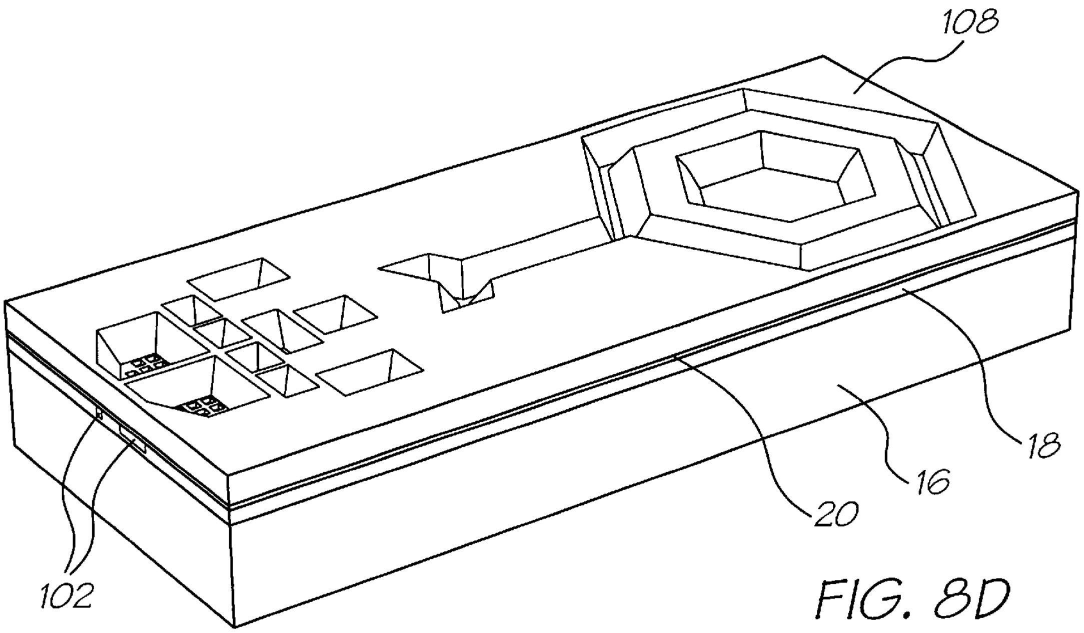
Figure 9D:
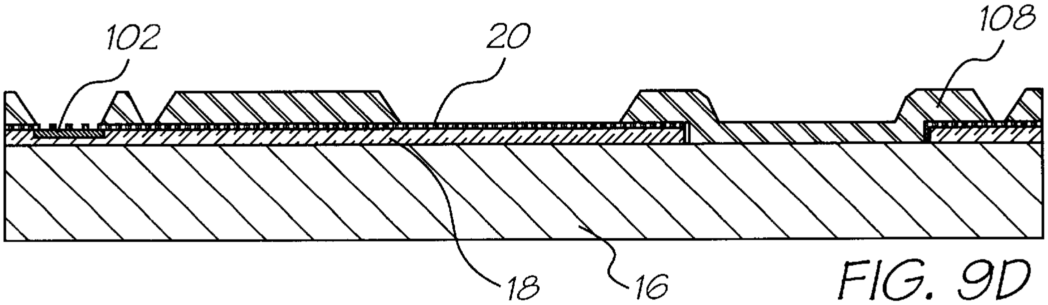
Figure 10D:
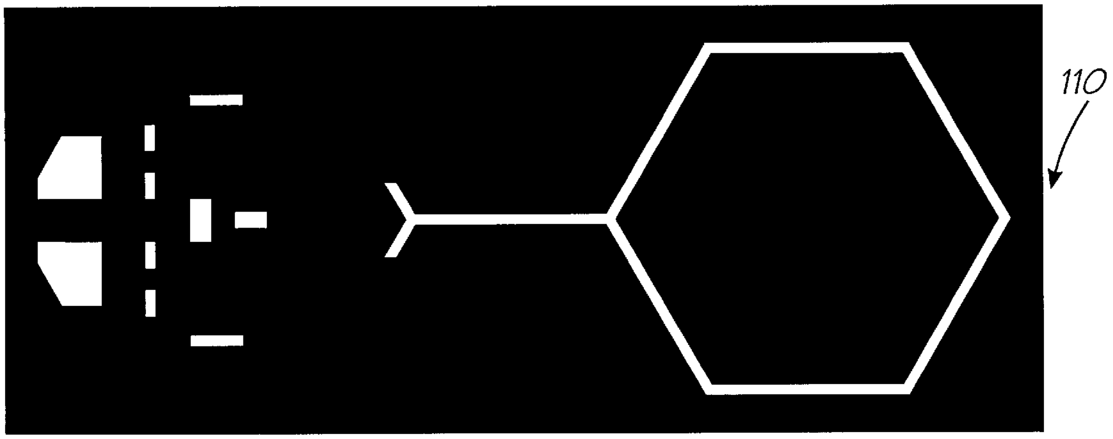

In FIG. 8*b* of the drawings, approximately 0.8 microns of aluminum 102 is deposited on the layer 18. Resist is spun on and the aluminum 102 is exposed to mask 104 and developed. The aluminum 102 is plasma etched down to the dielectric layer 18, the resist is stripped and the device is cleaned. This step provides the bond pads 56 and interconnects to the ink jet actuator 28. This interconnect is to an NMOS drive transistor and a power plane with connections made in the CMOS layer (not shown).

Approximately 0.5 microns of PECVD nitride is deposited as the CMOS passivation layer 20. Resist is spun on and the layer 20 is exposed to mask 106 whereafter it is developed. After development, the nitride is plasma etched down to the aluminum layer 102 and the silicon layer 16 in the region of the inlet aperture 42. The resist is stripped and the device cleaned.

A layer 108 of a sacrificial material is spun on to the layer 20. The layer 108 is 6 microns of photosensitive polyimide or approximately 4 microns of high temperature resist. The layer 108 is softbaked and is then exposed to mask 110 whereafter it is developed. The layer 108 is then hardbaked at 400° C. for one hour where the layer 108 is comprised of polyimide or at greater than 300° C. where the layer 108 is high temperature resist. It is to be noted in the drawings that the pattern-dependent distortion of the polyimide layer 108 caused by shrinkage is taken into account in the design of the mask 110.

Figure 8E:
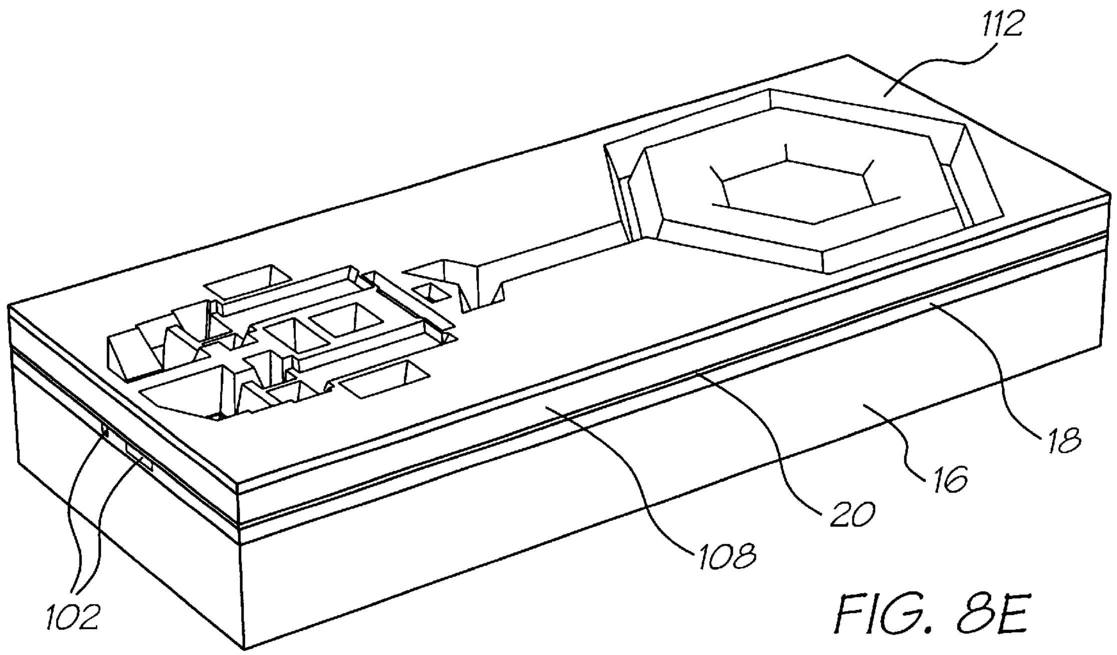
Figure 10E:
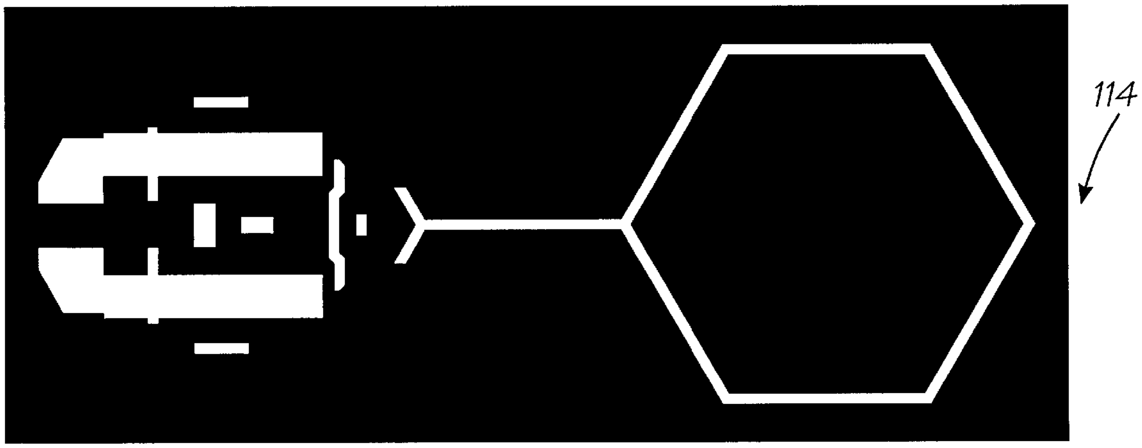
Figure 8F:
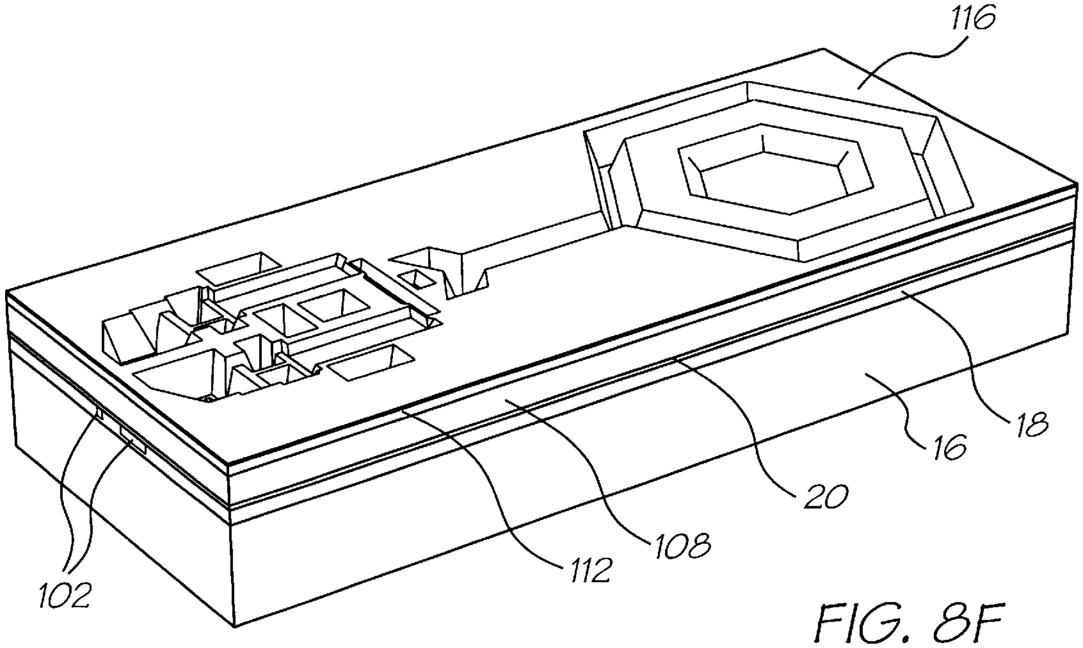
Figure 8G:
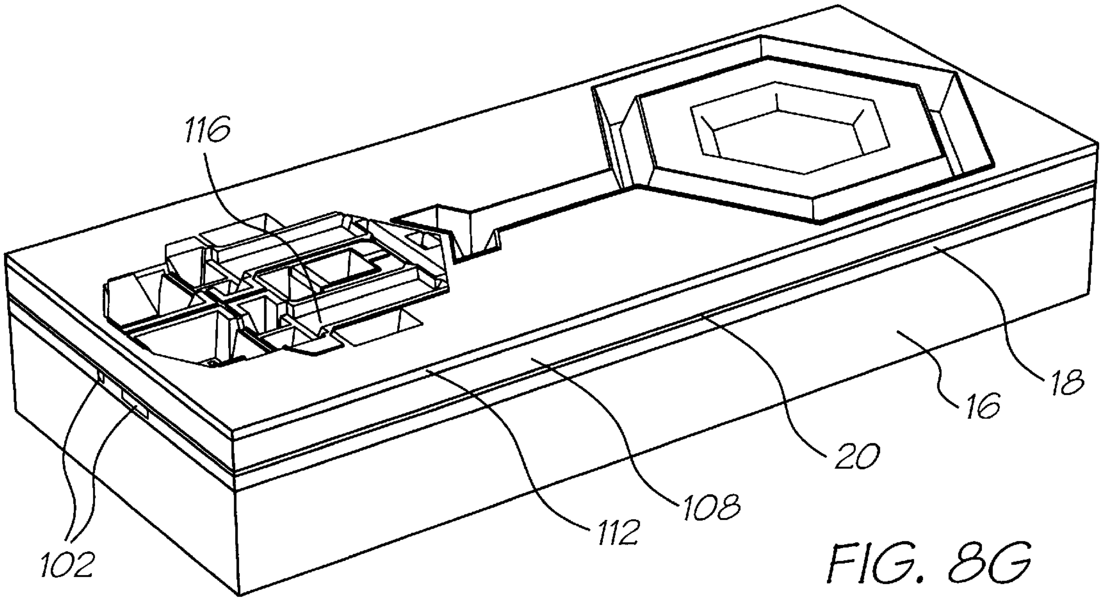
Figure 10F:
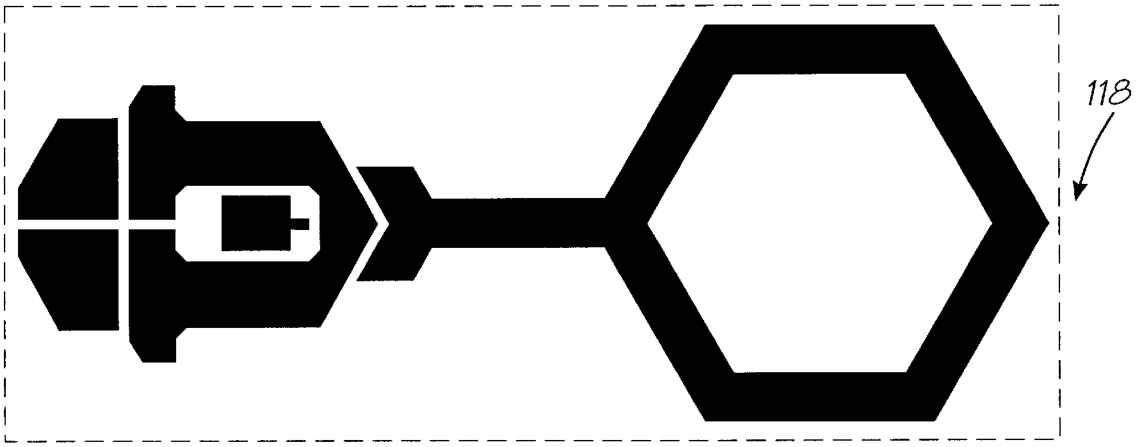
Figure 8H:
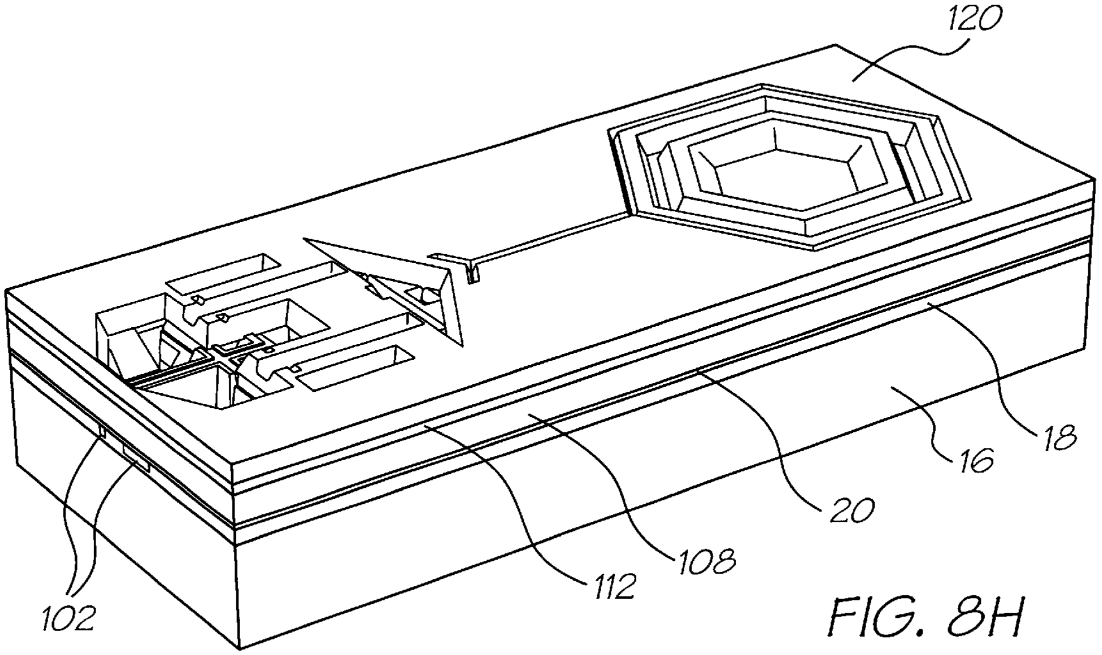
Figure 10G:
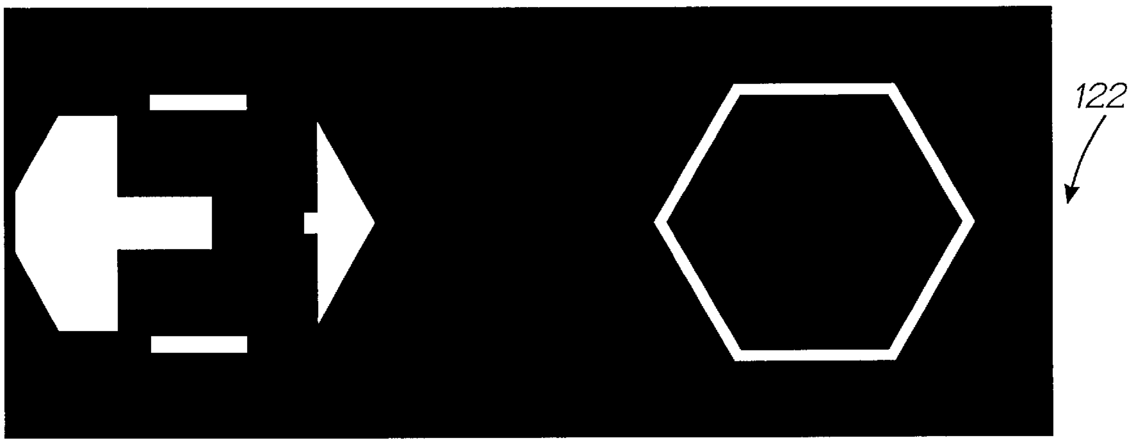
Figure 81:
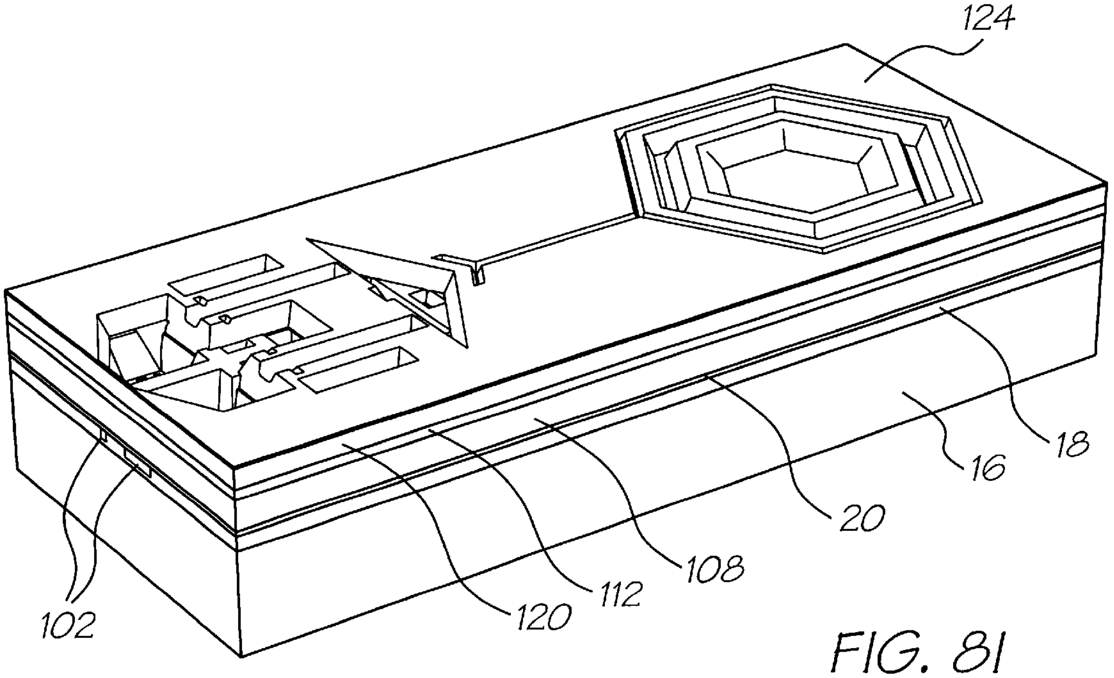
Figure 91:
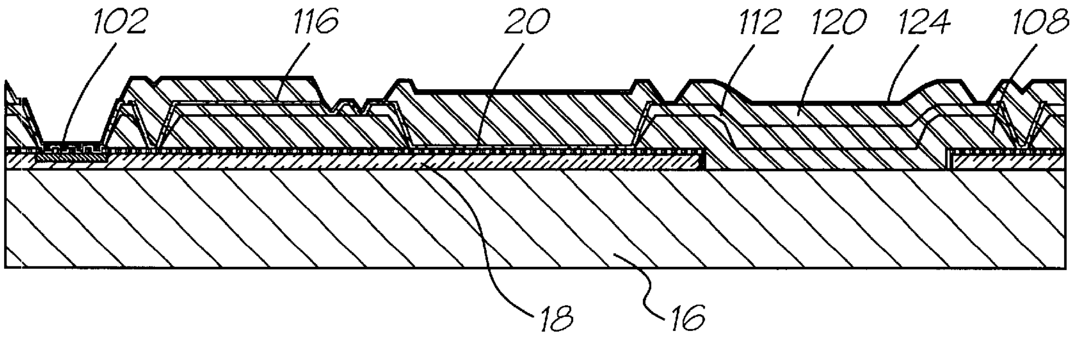
Figure 8J:
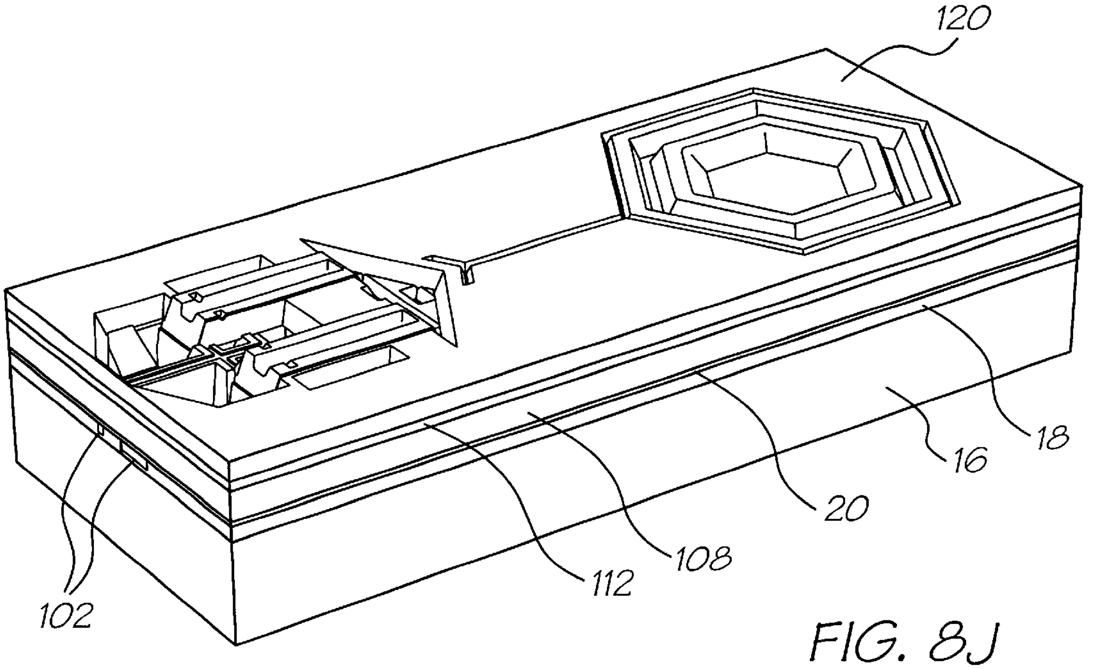
Figure 10H:
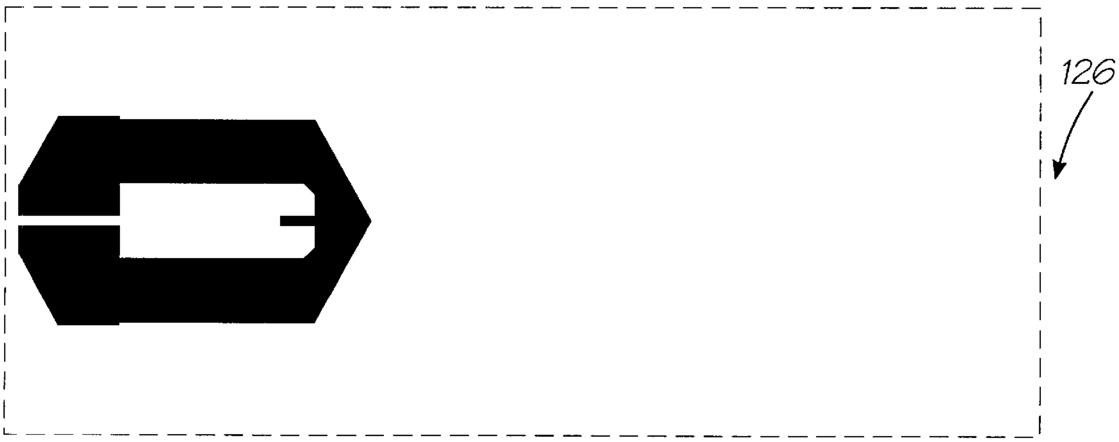
Figure 8K:
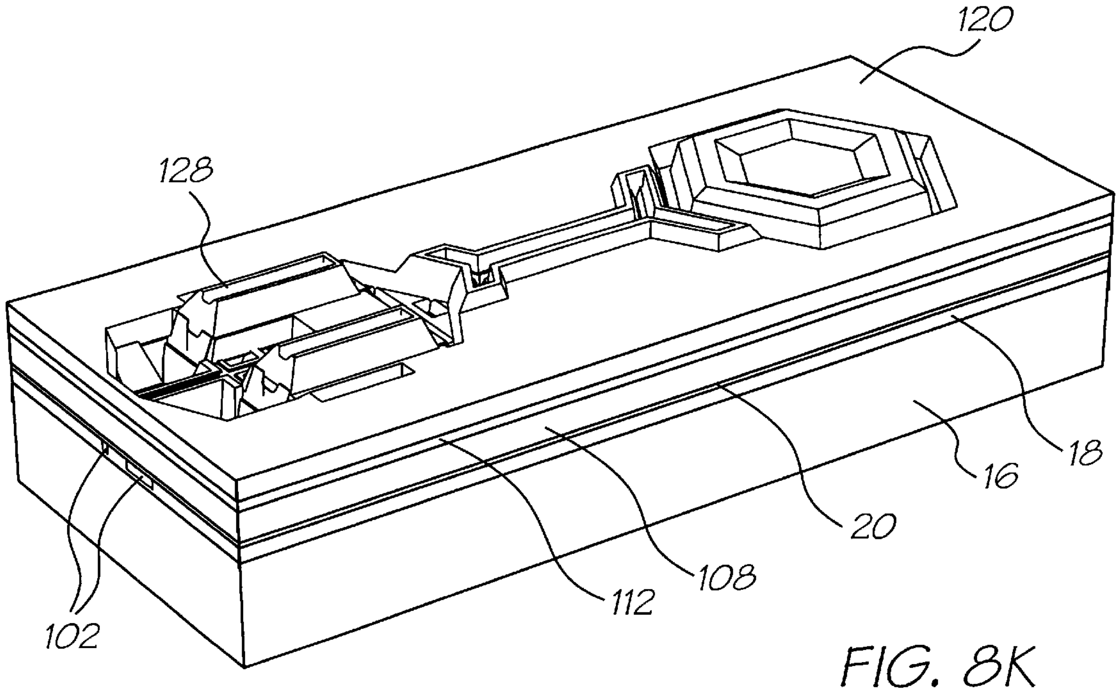

In the next step, shown in FIG. 8*e* of the drawings, a second sacrificial layer 112 is applied. The layer 112 is either 2 microns of photosensitive polyimide, which is spun on, or approximately 1.3 microns of high temperature resist. The layer 112 is softbaked and exposed to mask 114. After exposure to the mask 114, the layer 112 is developed. In the case of the layer 112 being polyimide, the layer 112 is hardbaked at 400° C. for approximately one hour. Where the layer 112 is resist, it is hardbaked at greater than 300° C. for approximately one hour.

A 0.2 micron multi-layer metal layer 116 is then deposited. Part of this layer 116 forms the passive beam 60 of the actuator 28.

The layer 116 is formed by sputtering 1,000 angstroms of titanium nitride (TiN) at around 300° C. followed by sputtering 50 angstroms of tantalum nitride (TaN). A further 1,000 angstroms of TiN is sputtered on followed by 50 angstroms of TaN and a further 1,000 angstroms of TiN.

Other materials, which can be used instead of TiN, are $TiB_2$, $MoSi_2$ or (Ti, Al)N.

The layer 116 is then exposed to mask 118, developed and plasma etched down to the layer 112 whereafter resist, applied to the layer 116, is wet stripped taking care not to remove the cured layers 108 or 112.

A third sacrificial layer 120 is applied by spinning on 4 microns of photosensitive polyimide or approximately 2.6 microns high temperature resist. The layer 120 is softbaked whereafter it is exposed to mask 122. The exposed layer is then developed followed by hardbaking. In the case of polyimide, the layer 120 is hardbaked at 400° C. for approximately one hour or at greater than 300° C. where the layer 120 comprises resist.

A second multi-layer metal layer 124 is applied to the layer 120. The constituents of the layer 124 are the same as the layer 116 and are applied in the same manner. It will be appreciated that both layers 116 and 124 are electrically conductive layers.

The layer 124 is exposed to mask 126 and is then developed. The layer 124 is plasma etched down to the polyimide or resist layer 120 whereafter resist applied for the layer 124 is wet stripped taking care not to remove the cured layers 108, 112 or 120. It will be noted that the remaining part of the layer 124 defines the active beam 58 of the actuator 28.

Figure 9E:
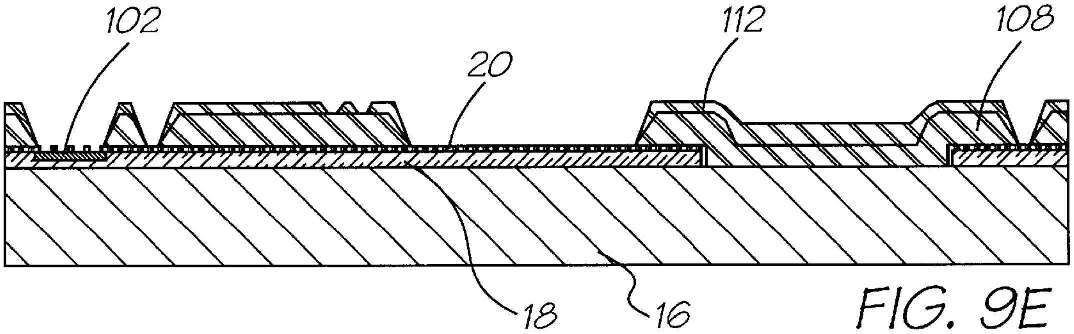
Figure 9F:
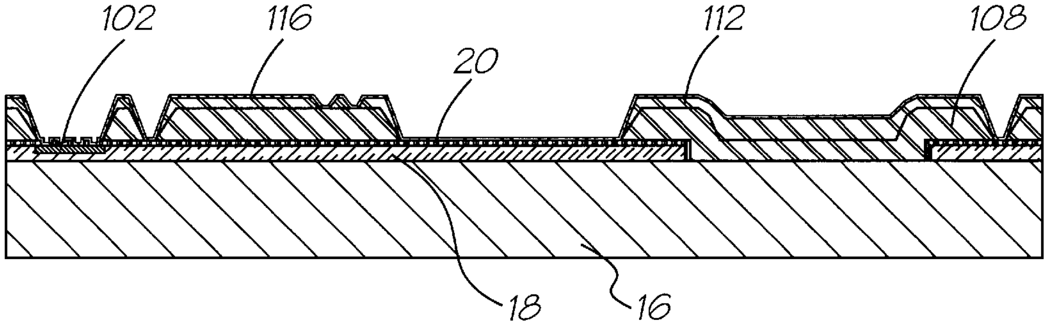
Figure 9G:
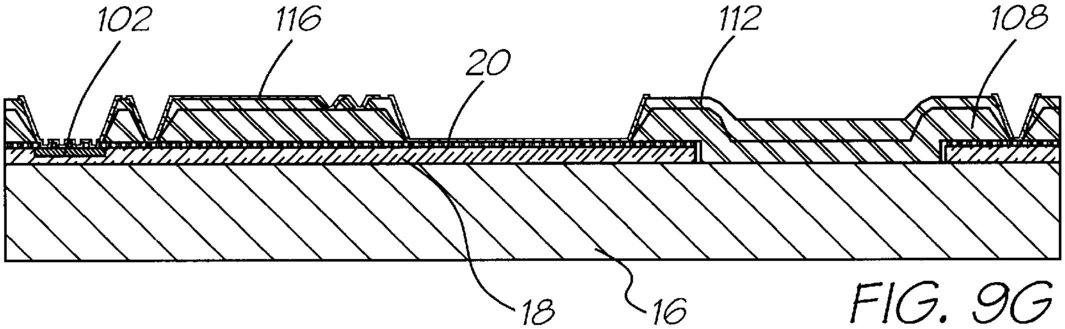
Figure 9H:
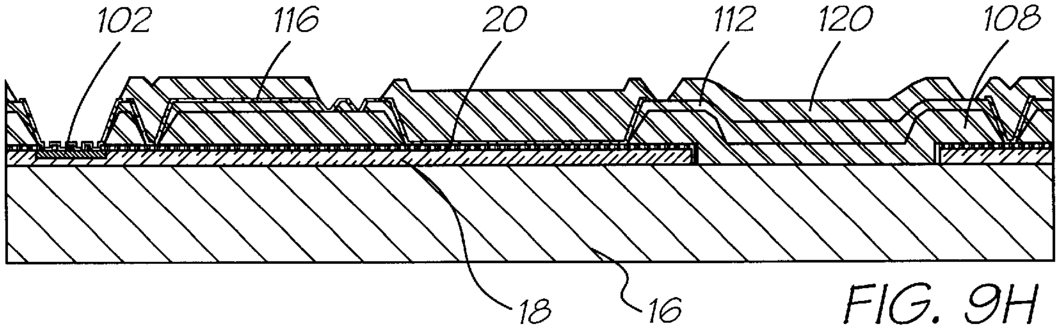
Figure 9J:
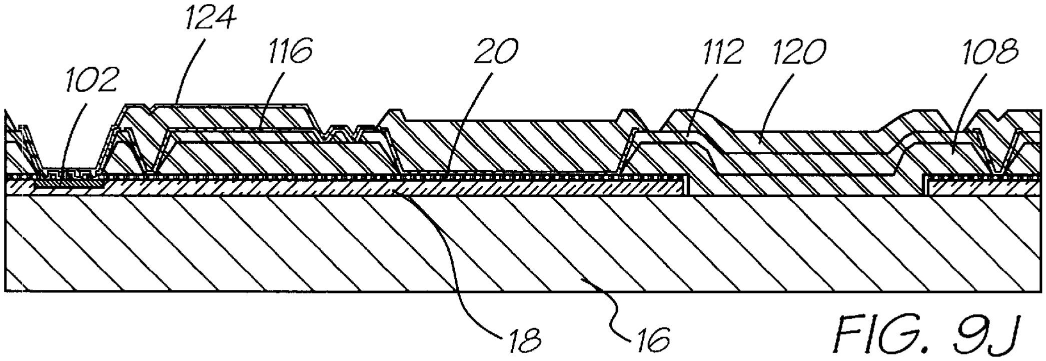
Figure 9K:
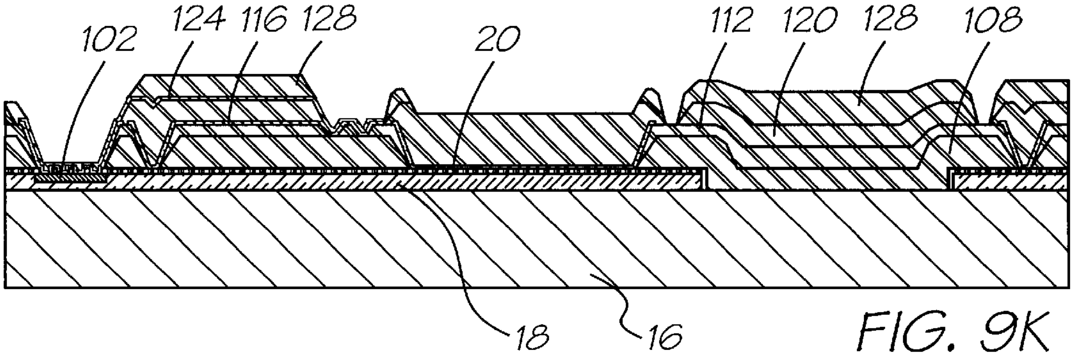
Figure 10I:
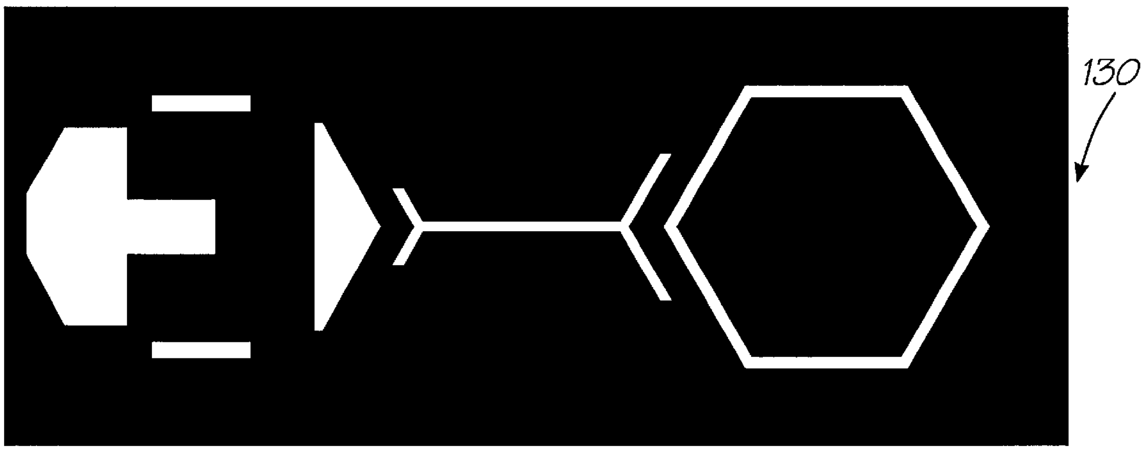

A fourth sacrificial layer 128 is applied by spinning on 4 $\mu$m of photosensitive polyimide or approximately 2.61 $\mu$m of high temperature resist. The layer 128 is softbaked, exposed to the mask 130 and is then developed to leave the island portions as shown in FIG. 9*k* of the drawings. The remaining portions of the layer 128 are hardbaked at 400° C. for approximately one hour in the case of polyimide or at greater than 300° C. for resist.

Figure 8L:
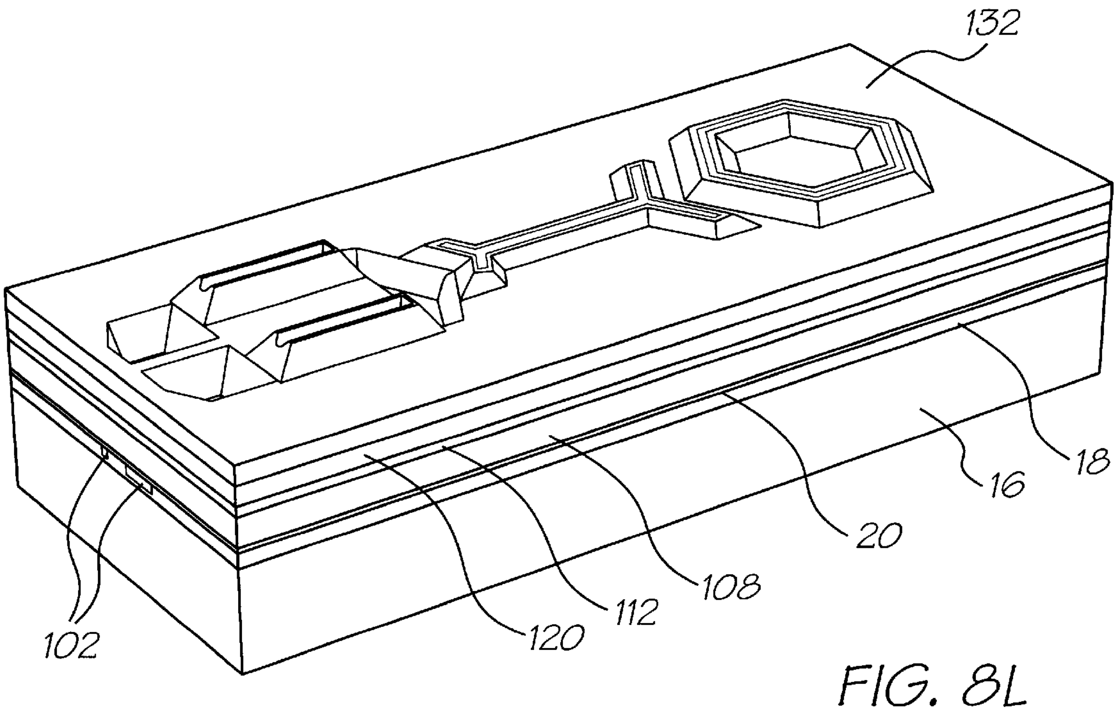
Figure 9L:
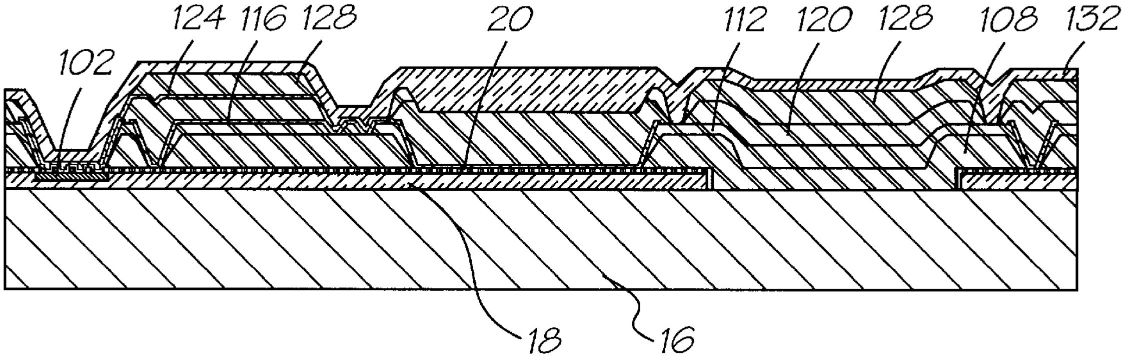
Figure 8M:
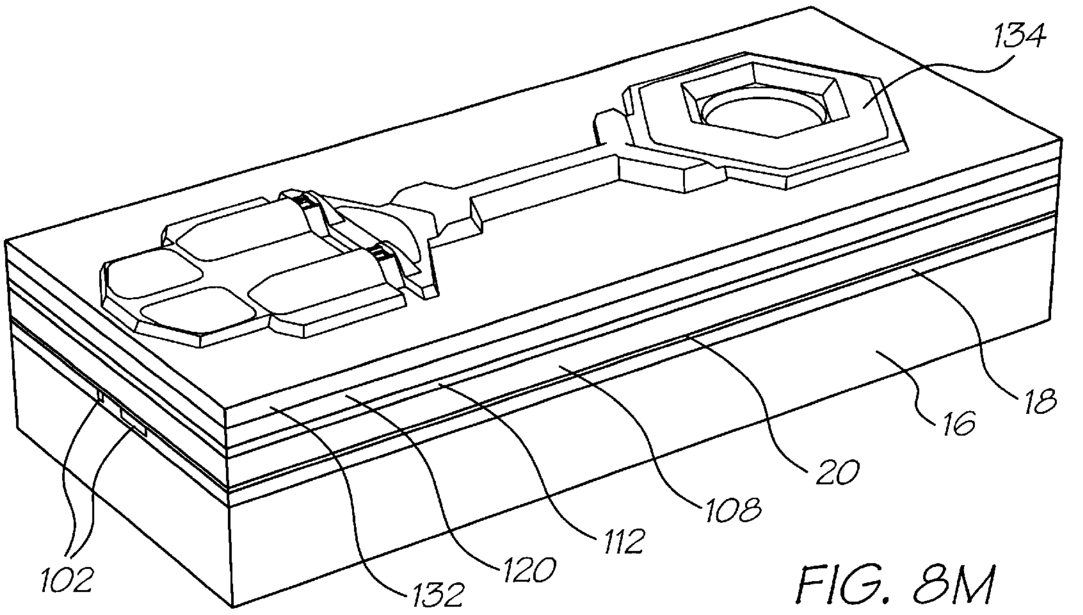
Figure 9M:
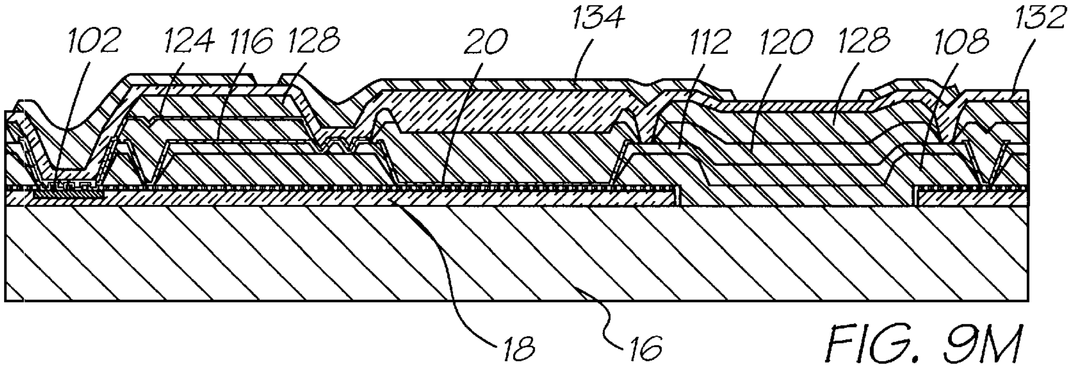
Figure 10J:
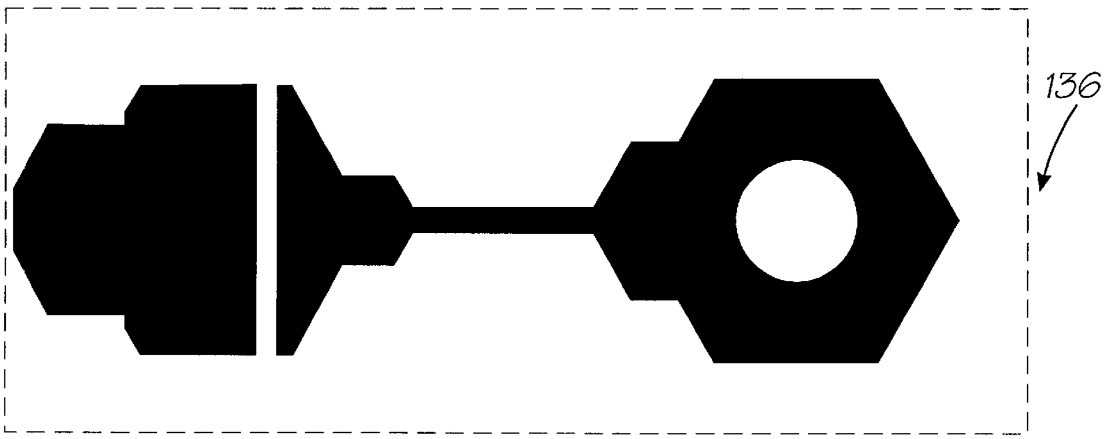
Figure 8N:
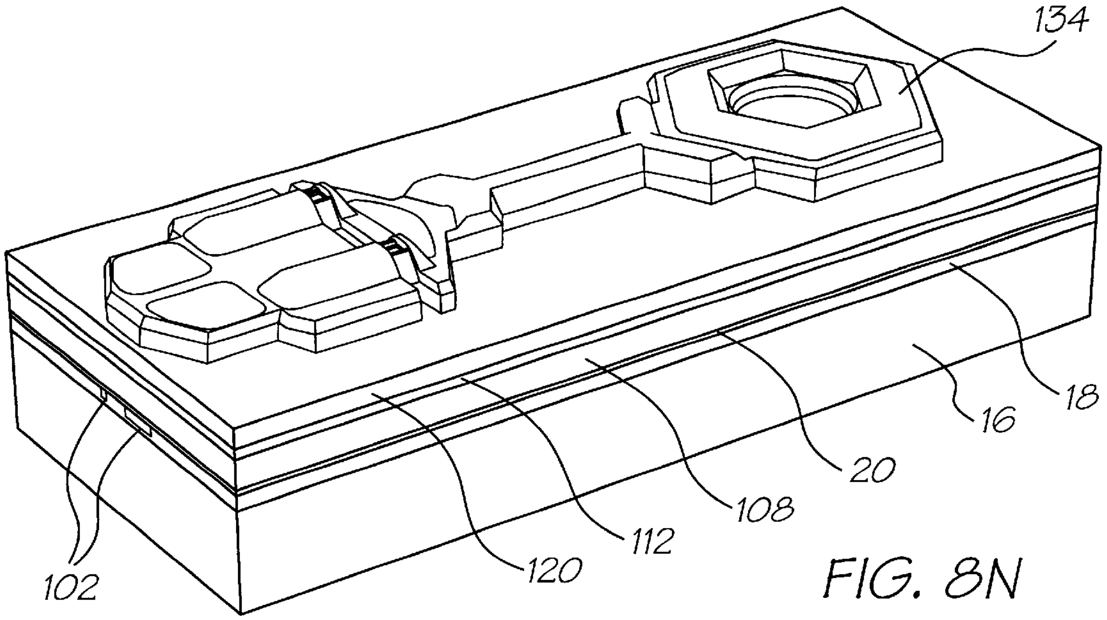
Figure 9N:
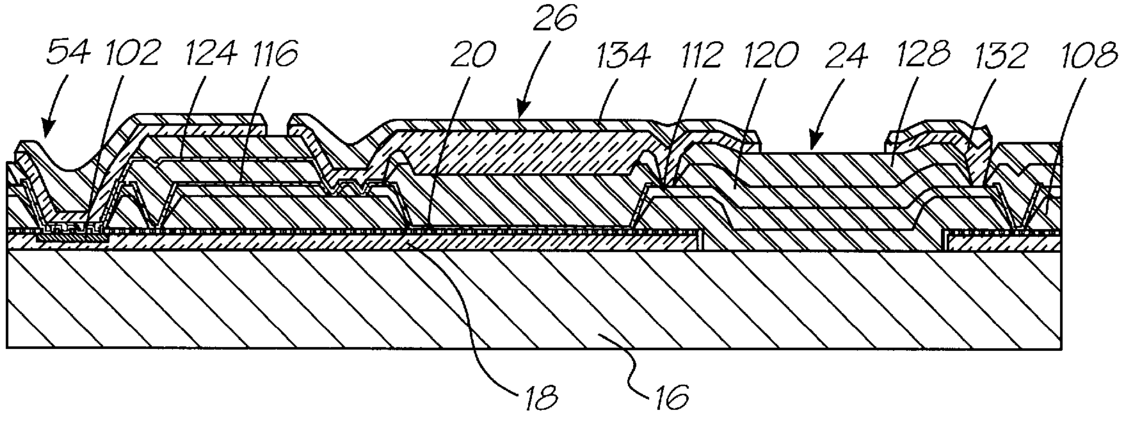
Figure 80:
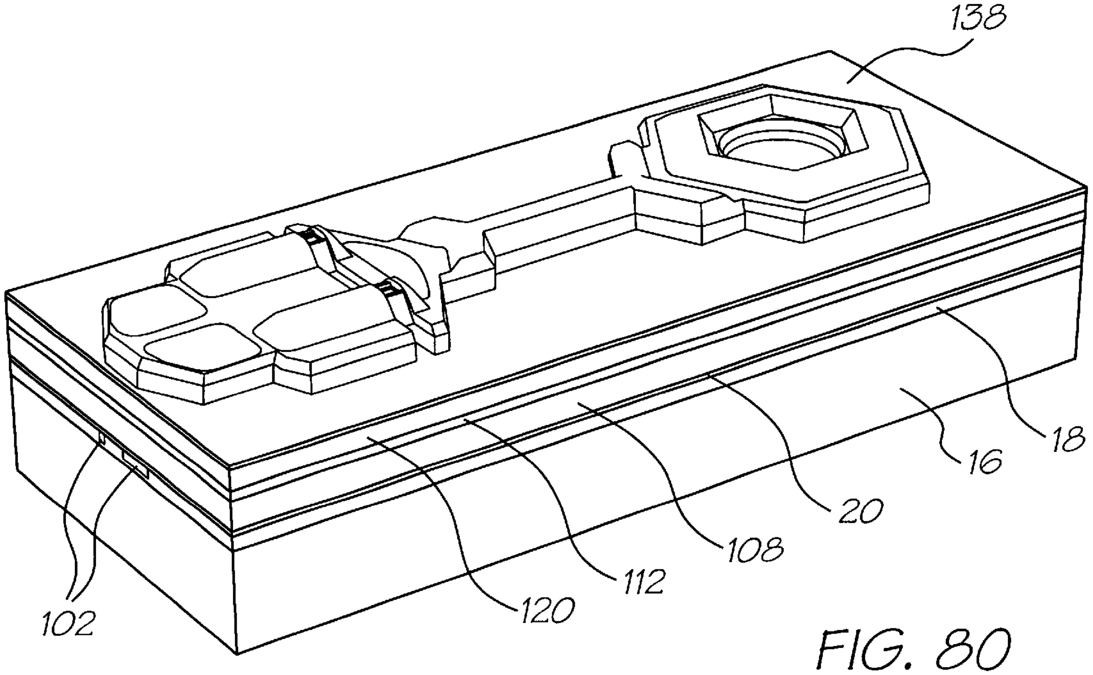
Figure 90:
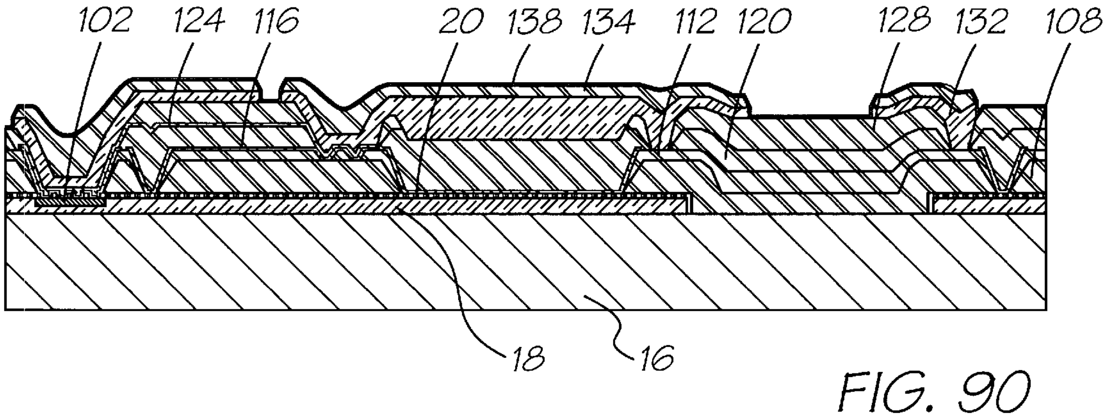

As shown in FIG. 8*l* of the drawing a high Young's modulus dielectric layer 132 is deposited. The layer 132 is constituted by approximately 1 micron of silicon nitride or aluminum oxide. The layer 132 is deposited at a temperature below the hardbaked temperature of the sacrificial layers 108, 112, 120, 128. The primary characteristics required for this dielectric layer 132 are a high elastic modulus, chemical inertness and good adhesion to TiN.

A fifth sacrificial layer 134 is applied by spinning on 2 microns of photosensitive polyimide or approximately 1.3 microns of high temperature resist. The layer 134 is softbaked, exposed to mask 136 and developed. The remaining portion of the layer 134 is then hardbaked at 400° C. for one hour in the case of the polyimide or at greater than 300° C. for the resist.

The dielectric layer 132 is plasma etched down to the sacrificial layer 128 taking care not to remove any of the sacrificial layer 134.

This step defines the nozzle opening 24, the lever arm 26 and the anchor 54 of the nozzle assembly 10.

A high Young's modulus dielectric layer 138 is deposited. This layer 138 is formed by depositing 0.2 micron of silicon nitride or aluminum nitride at a temperature below the hardbaked temperature of the sacrificial layers 108, 112, 120 and 128.

Figure 8P:
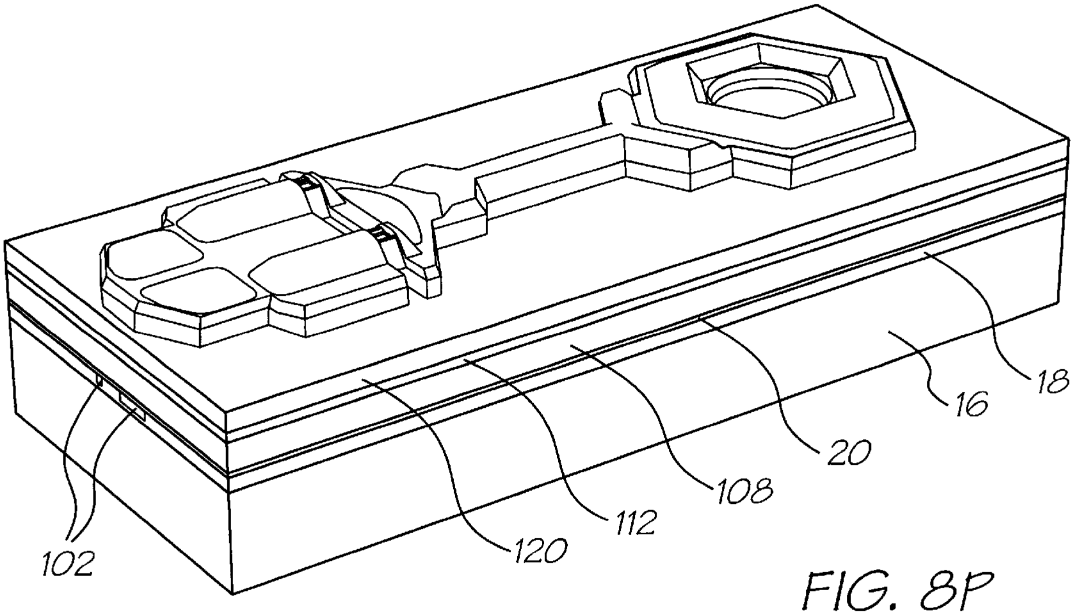
Figure 9P:
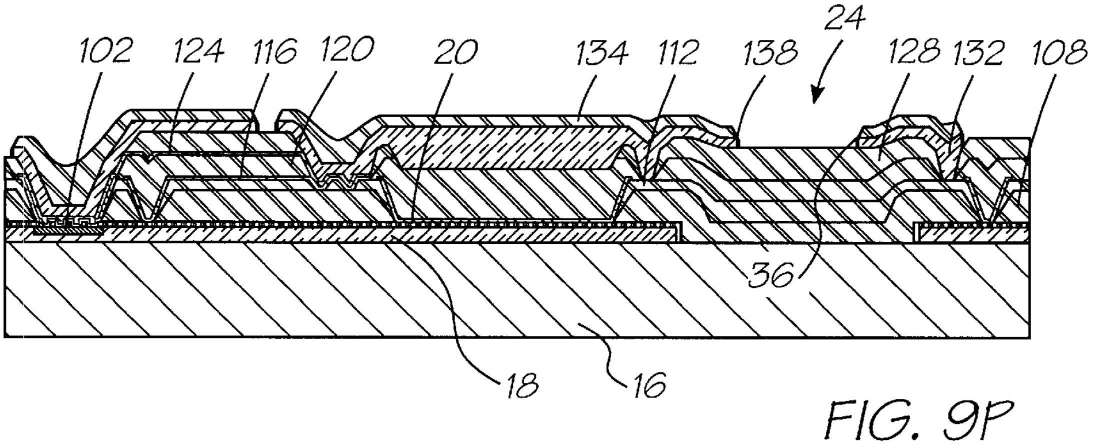
Figure 8Q:
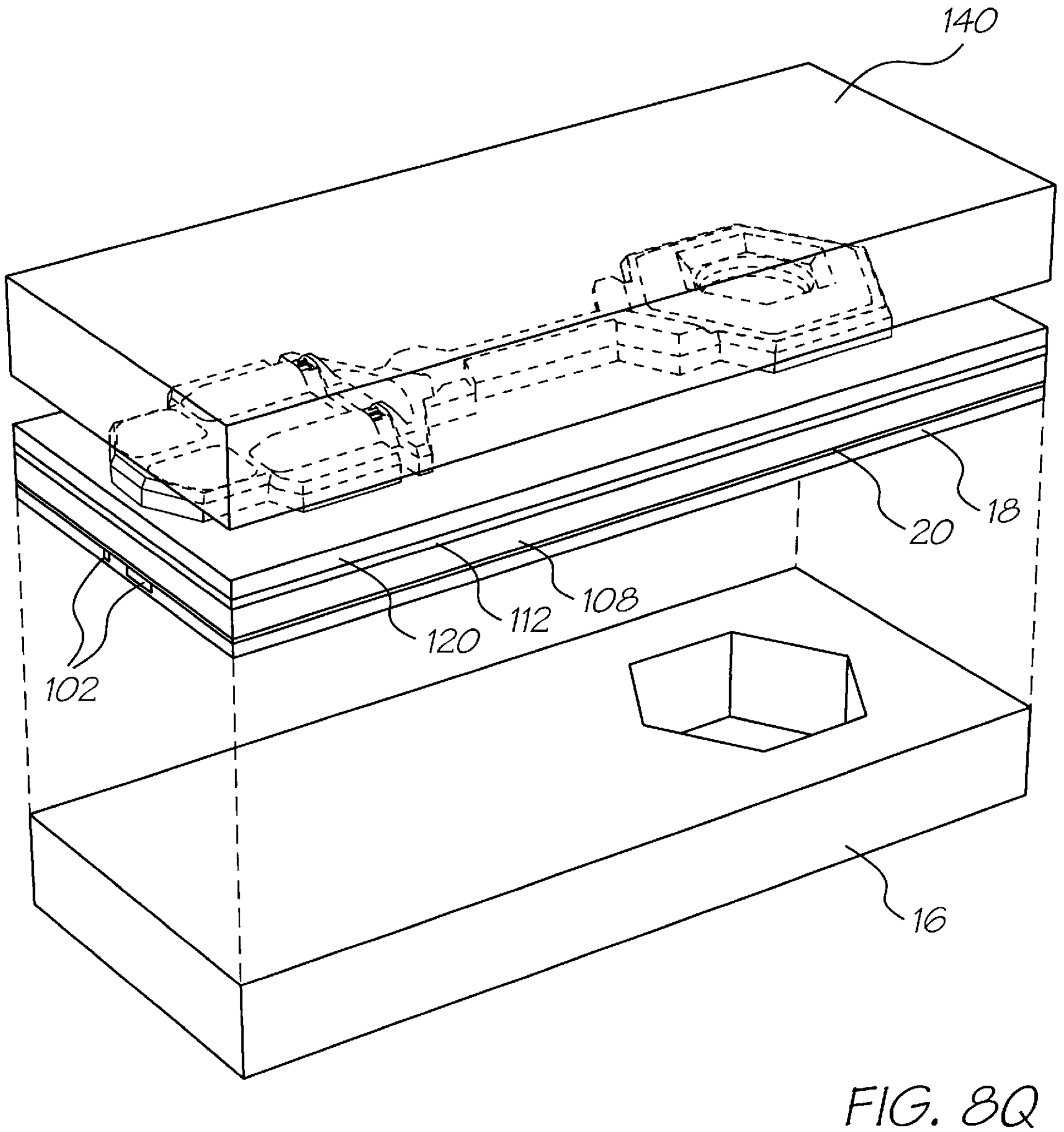

Then, as shown in FIG. 8*p* of the drawings, the layer 138 is anisotropically plasma etched to a depth of 0.35 microns. This etch is intended to clear the dielectric from all of the surface except the side walls of the dielectric layer 132 and the sacrificial layer 134. This step creates the nozzle rim 36 around the nozzle opening 24, which "pins" the meniscus 38 of ink, as described above.

An ultraviolet (UV) release tape 140 is applied. 4 Microns of resist is spun on to a rear of the silicon wafer 16. The wafer 16 is exposed to a mask 142 to back etch the wafer 16 to define the ink inlet channel 48. The resist is then stripped from the wafer 16.

Figure 8R:
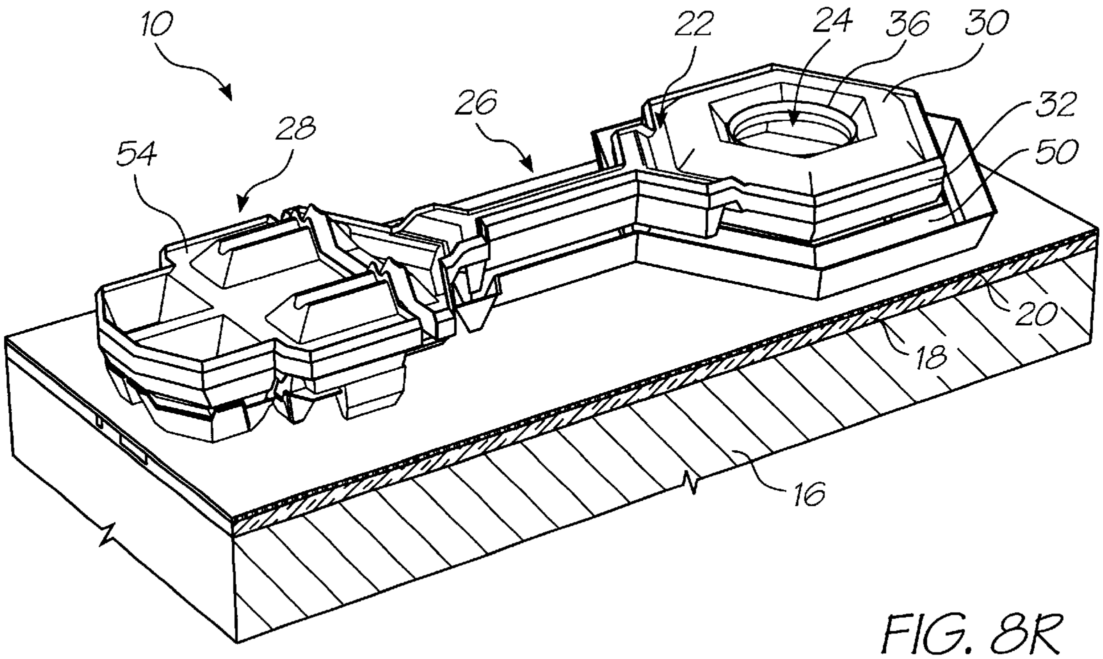
Figure 9R:
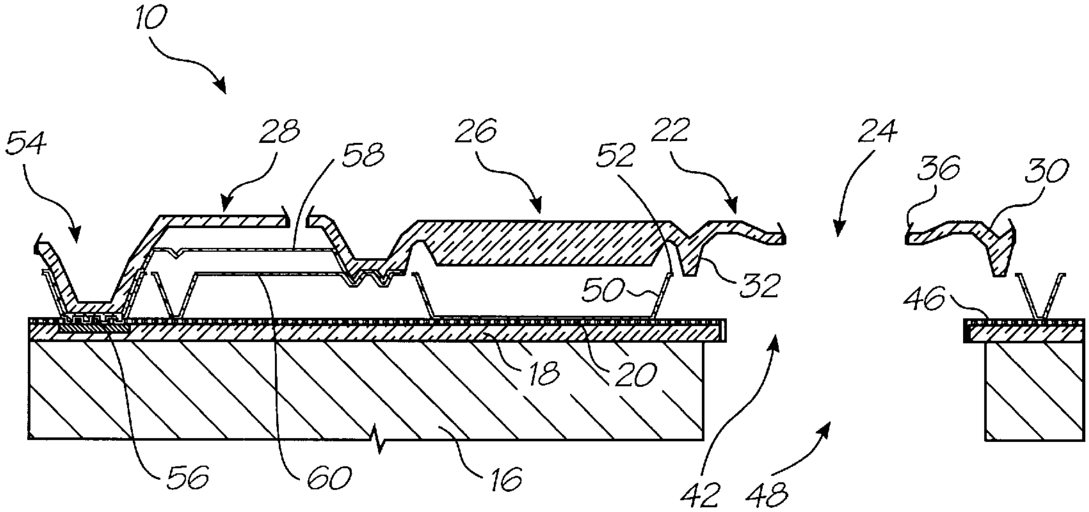
Figure 9Q:
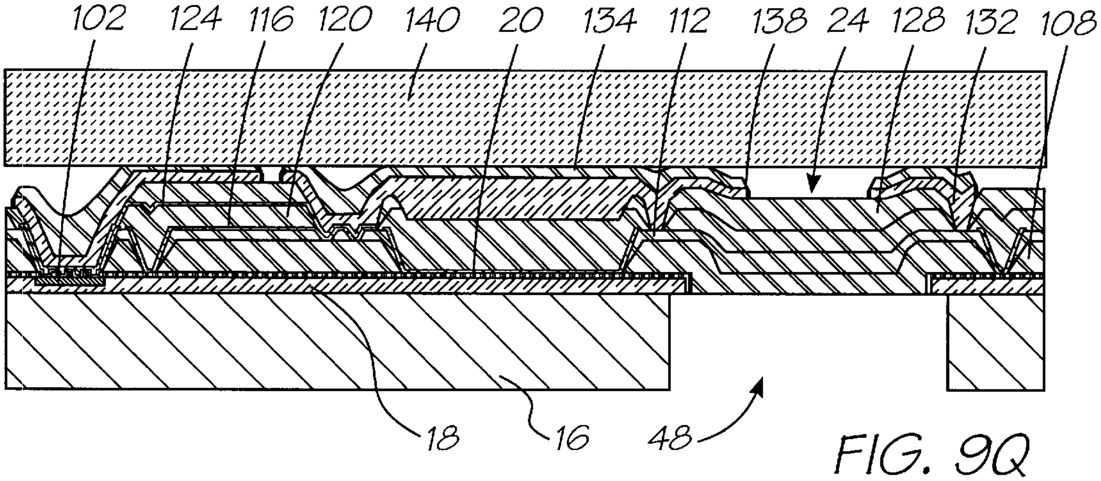
Figure 10K:
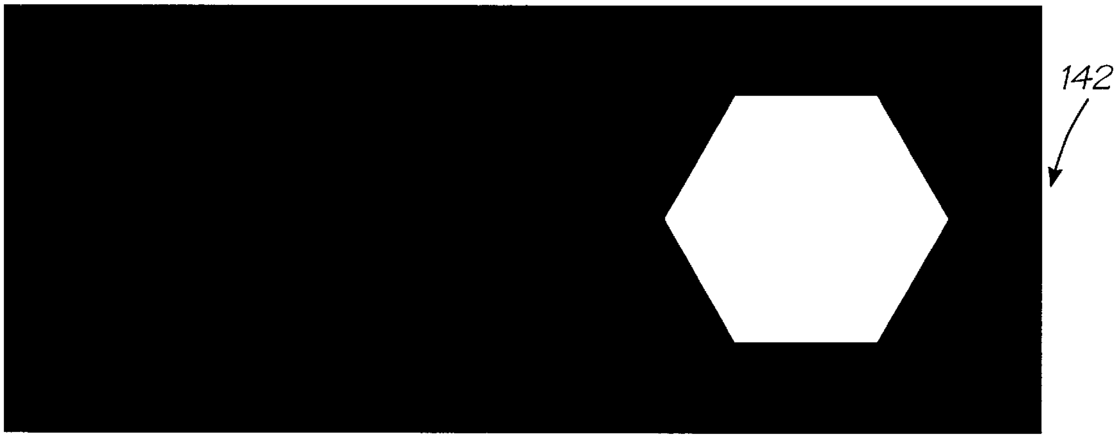
Figure 11A:
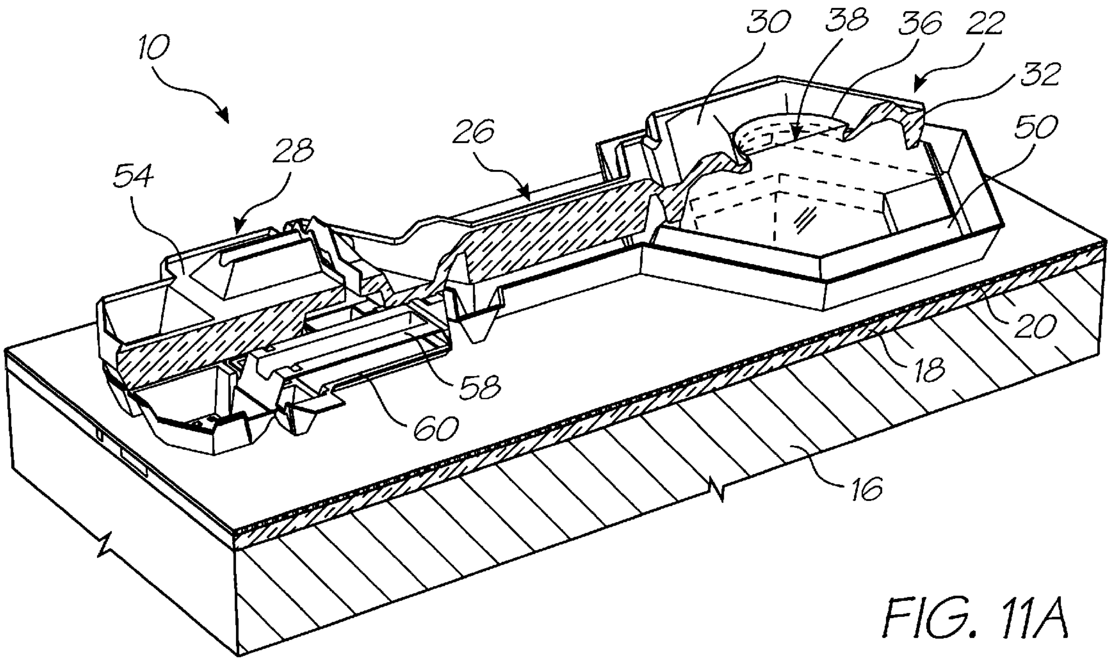
FIGS. 11*a* to 11*c* show three-dimensional views of an operation of the nozzle assembly of FIG. 1.
Figure 12A:
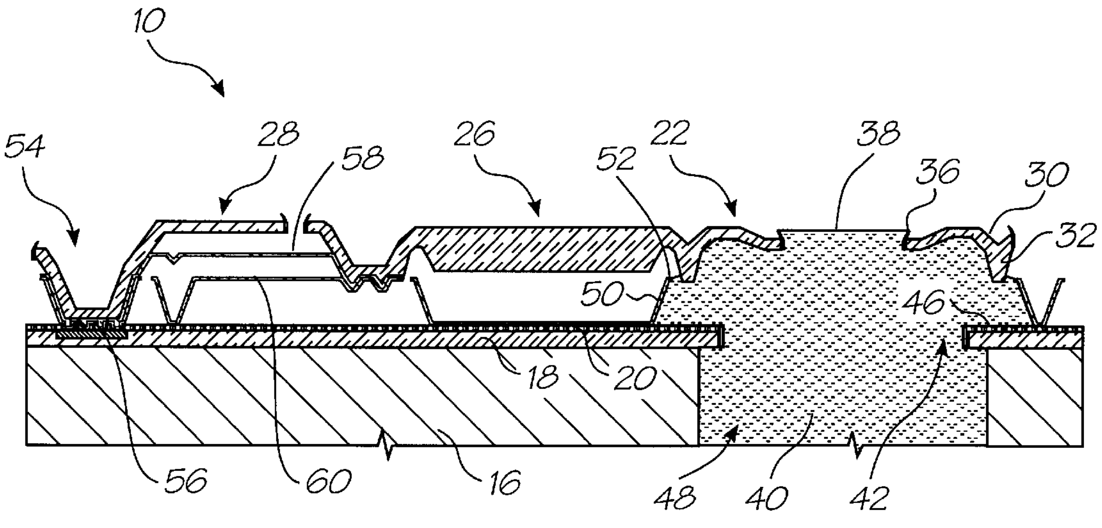
FIGS. 12*a* to 12*c* show sectional side views of an operation of the nozzle assembly of FIG. 1.
Figure 11B:
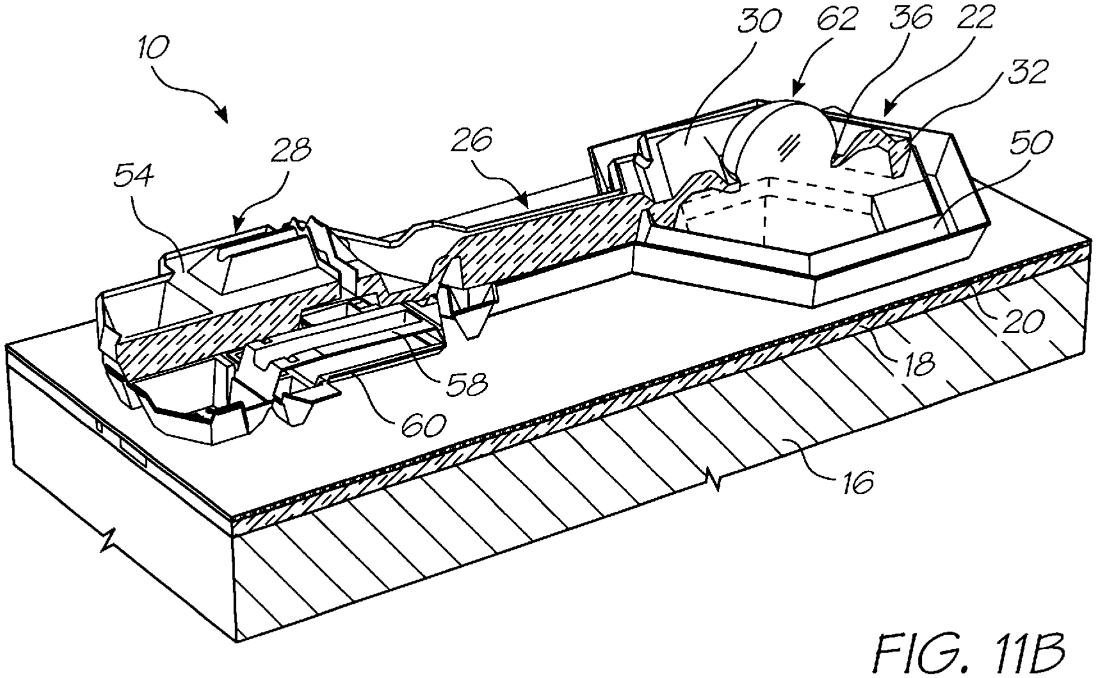
Figure 12B:
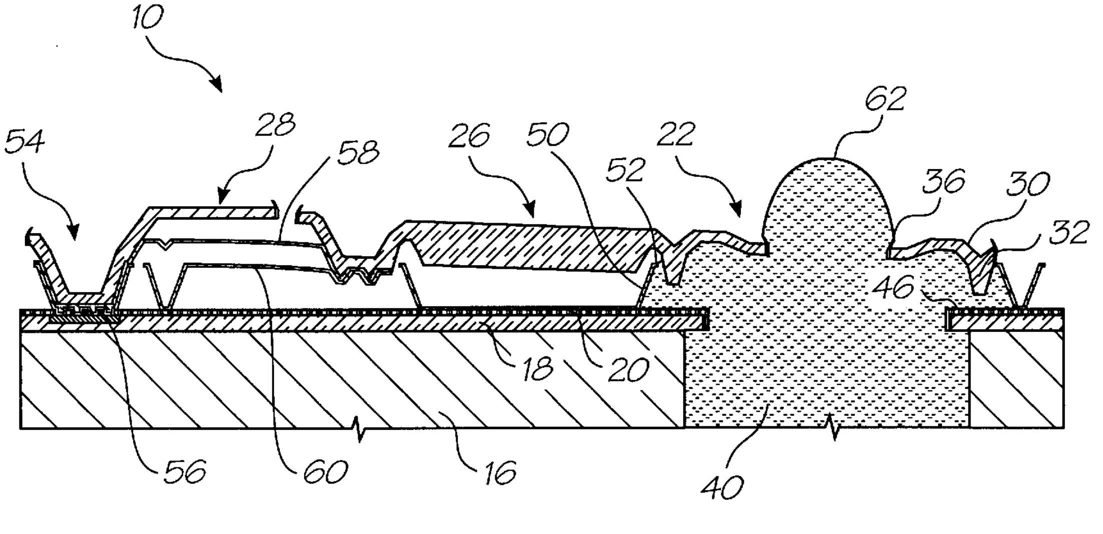
Figure 11C:
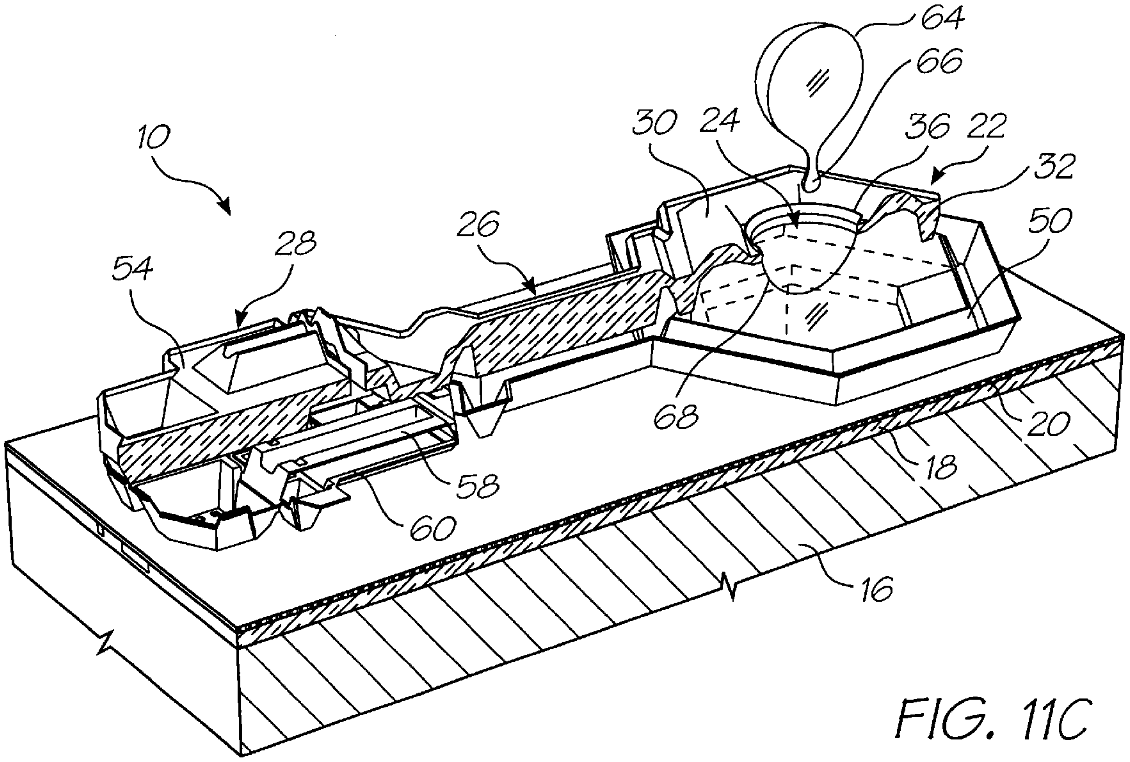
Figure 12C:
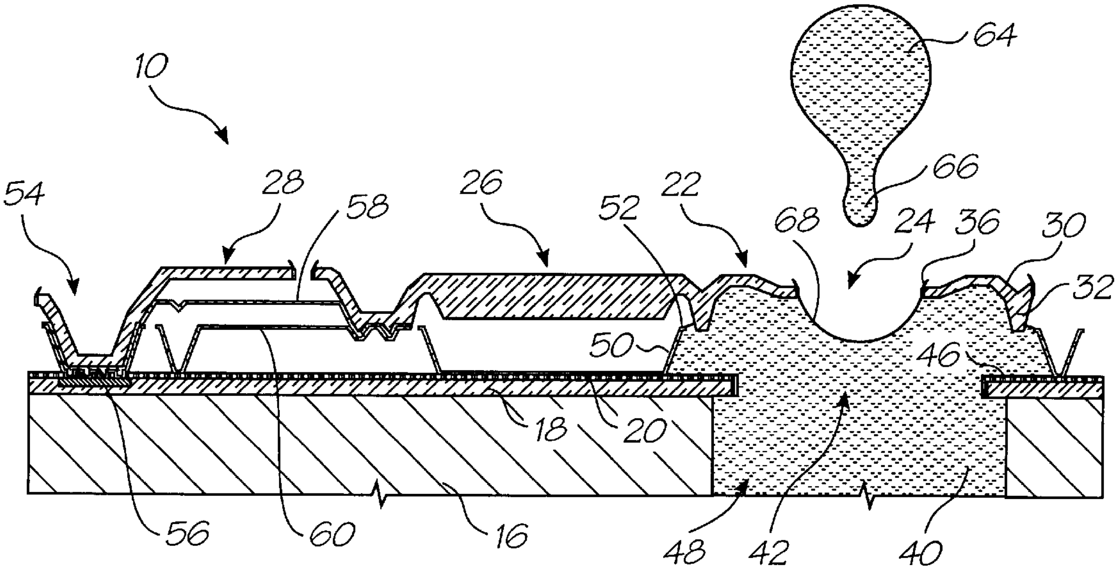

A further UV release tape (not shown) is applied to a rear of the wafer 16 and the tape 140 is removed. The sacrificial layers 108, 112, 120, 128 and 134 are stripped in oxygen plasma to provide the final nozzle assembly 10 as shown in FIGS. 8*r* and 9*r* of the drawings. For ease of reference, the reference numerals illustrated in these two drawings are the same as those in FIG. 1 of the drawings to indicate the relevant parts of the nozzle assembly 10. FIGS. 11 and 12 show the operation of the nozzle assembly 10, manufactured in accordance with the process described above with reference to FIGS. 8 and 9, and these figures correspond to FIGS. 2 to 4 of the drawings.

As is clear from the drawings and the description, the layer 116 forms the wall portion 50 as well as the passive beam 60 of the actuator 28. It follows that the steps of depositing the layer 116 and etching the layer 116 results in the fabrication of two components of each nozzle assembly.

As discussed in the background, the saving of a step or steps in the fabrication of a chip can result in the saving of substantial expenses in mass manufacture. It follows that the fact that the wall portion 50 can be fabricated in a common stage with the passive beam 60 of the actuator 28 saves a substantial amount of cost and time.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

We claim:

1. A method of fabricating a printhead chip for an ink jet printhead the printhead chip including a plurality of nozzle assemblies positioned on a wafer substrate that incorporates a drive circuitry layer, each nozzle assembly having nozzle chamber walls and a roof that define a nozzle chamber and an ink ejection port and an actuator, connected to the drive circuitry layer, that is operatively positioned with respect to the nozzle chamber to act on ink within the nozzle chamber to eject the ink from the nozzle chamber, the method comprising the steps of:

depositing a first sacrificial layer on the wafer substrate;

etching the first sacrificial layer to form a deposit area for an actuator layer;

depositing actuator material on the first sacrificial layer to form the actuator layer;

etching the actuator layer to define the actuator and a first part of the nozzle chamber walls of each nozzle assembly;

etching the first sacrificial layer to release each actuator and each first part of the nozzle chamber walls; and etching at least one of the wafer substrate and the first sacrificial layer to define a plurality of ink inlets, so that each ink inlet is in fluid communication with a respective nozzle chamber.

2. A method as claimed in claim 1, which includes the steps of:

depositing a second layer of sacrificial material on the actuator layer;

etching the second layer of sacrificial material to form a deposit area for a structural layer;

depositing structural material on the second layer of sacrificial material to form the structural layer; and etching the structural layer to form a second part of the nozzle chamber walls of each nozzle assembly, the steps of depositing the first and second layers of sacrificial material, the actuator material and the structural material and etching the sacrificial material, the actuator material and the structural material being carried out so that the first and second parts of the nozzle chamber walls define a fluidic seal between the first and second parts when the nozzle chamber is filled with ink.

3. A method as claimed in claim 2, in which the steps of depositing the first and second layers of sacrificial material, the actuator material and the structural material and etching the sacrificial material, the actuator material and the structural material are carried out so that the structural material defines the roof wall in addition to said second part of the nozzle chamber walls and the ink ejection port defined in the roof wall.

4. A method as claimed in claim 3, in which the steps of depositing the first and second layers of sacrificial material, the actuator material and the structural material and etching the sacrificial material, the actuator material and the structural material are carried out so that the first part of the nozzle chamber walls is fast with the substrate, while the second part is connected to the actuator to be displaceable towards the first part to reduce a volume of the nozzle chamber to eject ink from the ink ejection port and away from the first part to refill the nozzle chamber.

5. A printhead chip for an inkjet printhead, the printhead chip comprising a wafer substrate;

a drive circuitry layer positioned in the wafer substrate;

a plurality of nozzle assemblies positioned on the wafer substrate, each nozzle assembly comprising nozzle chamber walls and roof walls that defame a plurality of nozzle chambers and ink ejection ports, each ink ejection port being in fluid communication with a respective nozzle chamber; and a plurality of actuators connected to the drive circuitry layer, each actuator being operatively positioned with respect to a corresponding nozzle chamber so that each actuator can act on ink within a respective nozzle chamber to eject the ink from that nozzle chamber, the actuator and a first part of the nozzle chamber walls both constituting actuator material; and one of the wafer and nozzle chamber walls defaming an ink inlet in fluid communication with the nozzle chamber.

6. A printhead chip as claimed in claim 5, in which the first part of the nozzle chamber walls is fast with the substrate and a second part of the nozzle chamber walls and the roof walls are each connected to respective actuators to be displaceable towards the substrate to reduce a volume in each nozzle chamber to eject ink from the ink ejection port and away from the substrate to refill the nozzle chamber.

7. A printhead chip as claimed in claim 6, in which the first and second parts of the nozzle chamber walls are shaped to define a fluidic seal to inhibit the egress of ink from the nozzle chambers when the first and second parts of the nozzle chamber walls are displaced with respect to each other.

8. A printhead chip as claimed in claim 6, in which each actuator is elongate with one end anchored to the substrate in electrical connection with the drive circuitry layer and an opposed end connected to the second part of the nozzle chamber walls and roof wall, the actuator being of a material and being configured so that the actuator is displaced towards the substrate when heated and away from the substrate when cooled, to displace the actuator and thus the nozzle chamber walls and roof wall towards and away from the substrate.

* * * * *

UNITED STATES PATENT AND TRADEMARK OFFICE
CERTIFICATE OF CORRECTION

PATENT NO. : 6,546,628 B2
DATED : April 15, 2003
INVENTOR(S) : Kia Silverbrook

It is certified that error appears in the above-identified patent and that said Letters Patent is hereby corrected as shown below:

Column 10,
Line 11, Claim 5 should read:

5. A printhead chip for an inkjet printhead, the printhead chip comprising
a wafer substrate;
a drive circuitry layer positioned in the wafer substrate;
a plurality of nozzle assemblies positioned on the wafer substrate, each nozzle assembly comprising
nozzle chamber walls and roof walls that define a plurality of nozzle chambers and ink ejection ports, each ink ejection port being in fluid communication with a respective nozzle chamber; and
a plurality of actuators connected to the drive circuitry layer, each actuator being operatively positioned with respect to a corresponding nozzle chamber so that each actuator can act on ink within a respective nozzle chamber to eject the ink from that nozzle chamber, the actuator and a first part of the nozzle chamber walls both constituting actuator material; and
one of the wafer and nozzle chamber walls defining an ink inlet in fluid communication with the nozzle chamber.

Signed and Sealed this

Thirtieth Day of September, 2003

JAMES E. ROGAN
*Director of the United States Patent and Trademark Office*